(12) United States Patent  
Koyama et al.

(10) Patent No.: US 9,310,866 B2  
(45) Date of Patent: Apr. 12, 2016

(54) SEMICONDUCTOR DEVICE AND ALARM DEVICE

(71) Applicant: Semiconductor Energy Laboratory Co., Ltd., Atsugi-shi, Kanagawa-ken (JP)

(72) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 111 days.

(21) Appl. No.: 13/904,391

(22) Filed: May 29, 2013

(65) Prior Publication Data

US 2013/0326244 A1 Dec. 5, 2013

(30) Foreign Application Priority Data

Jun. 1, 2012 (JP) .................................. 2012-126365  
Jul. 18, 2012 (JP) .................................. 2012-159898

(51) Int. Cl.  
*G06F 1/00* (2006.01)  
*G06F 1/32* (2006.01)  
*G06F 1/26* (2006.01)  
(Continued)

(52) U.S. Cl.  
CPC ............... *G06F 1/26* (2013.01); *G06F 1/3234* (2013.01); *G08B 17/107* (2013.01); *G06F 1/3203* (2013.01); *G06F 1/3287* (2013.01);  
(Continued)

(58) Field of Classification Search  
CPC . G06F 1/3203; G06F 1/3287; G06F 11/1456; G06F 11/1458

USPC ................. 713/300, 320, 323; 116/4, 5, 6, 75  
See application file for complete search history.

(56) References Cited

U.S. PATENT DOCUMENTS 5,731,856 A 3/1998 Kim et al.  
5,744,864 A 4/1998 Cillessen et al.  
(Continued)

FOREIGN PATENT DOCUMENTS

CN 102656801 A 9/2012  
EP 1 737 044 A1 12/2006  
(Continued)

OTHER PUBLICATIONS

International Search Report, PCT Application No. PCT/JP2013/064426, dated Aug. 20, 2013, 3 pages.  
(Continued)

*Primary Examiner* — Michael J Brown  
(74) *Attorney, Agent, or Firm* — Fish & Richardson P.C.

(57) ABSTRACT

In the microcomputer in the alarm device, supply of power to a sensor portion or a CPU in a sensor is allowed or stopped by a power gate controlled by a power gate controller. In addition, a volatile memory portion and a nonvolatile memory portion are provided in the CPU, data of the volatile memory portion is stored in the nonvolatile memory portion before supply of power to the CPU is stopped, and the data of the nonvolatile memory portion is restored to the volatile memory portion after the supply of power to the CPU is resumed. Thus, during an interval between measurement periods, supply of power to the sensor portion and the CPU can be stopped, so that low power consumption can be achieved compared with the case where power is continuously supplied.

28 Claims, 15 Drawing Sheets

(51) Int. Cl.
  *G08B 17/107* (2006.01)
  *G06F 11/14* (2006.01)
  *G11C 5/14* (2006.01)

(52) U.S. Cl.
  CPC ......... *G06F11/1456* (2013.01); *G06F 11/1458* (2013.01); *G11C 5/148* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,283,679 B2 | 10/2012 | Yamazaki et al. |
| 8,362,538 B2 | 1/2013 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0207776 A1 | 8/2010 | Takuno et al. |
| 2011/0156024 A1 | 6/2011 | Koyama et al. |
| 2012/0002090 A1 | 1/2012 | Aoki et al. |
| 2013/0127497 A1 | 5/2013 | Koyama |
| 2013/0261835 A1 | 10/2013 | Takahashi et al. |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-073785 A | 3/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-157423 A | 7/2009 |
| JP | 2009-237692 A | 10/2009 |
| JP | 2010-267136 A | 11/2010 |
| JP | 2011-151796 A | 8/2011 |
| JP | 2012-034354 A | 2/2012 |
| KR | 2012-0002928 A | 1/2012 |
| KR | 2012-0127587 A | 11/2012 |
| TW | 201135733 A | 10/2011 |
| TW | 201216699 A | 4/2012 |
| WO | 2004/114391 A1 | 12/2004 |
| WO | 2009/037895 A1 | 3/2009 |
| WO | 2011/078373 A1 | 6/2011 |

OTHER PUBLICATIONS

Written Opinion, PCT Application No. PCT/JP2013/064426, dated Aug. 20, 2013, 5 pages.
Ohara, H et al., "Amorphous In-Ga-Zn-Oxide TFTs with Suppressed Variation for 4.0 inch QVGA AMOLED Display," AM-FPD '09

(56) References Cited

OTHER PUBLICATIONS

Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," PHILOSOPHICAL MAGAZINE, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H "Current Status of, Challenges to, and Perspective View of AM-OLED," IDW '06 : Procceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y. et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM NEWSLETTER Newsletter, Mar. 1995, vol. 150, pp. 1-4 with English Translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs with a Novel Passivation Layer," SID Digest '09 : SID International Symposium Digest of Technical Papers, May 31, 2009, pp. 284-287.

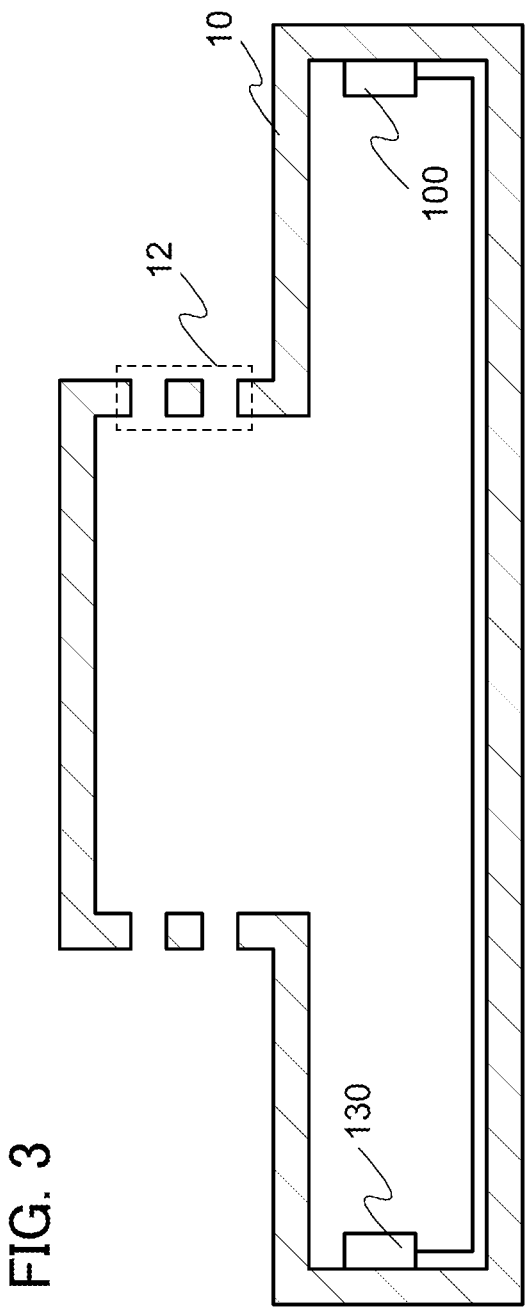

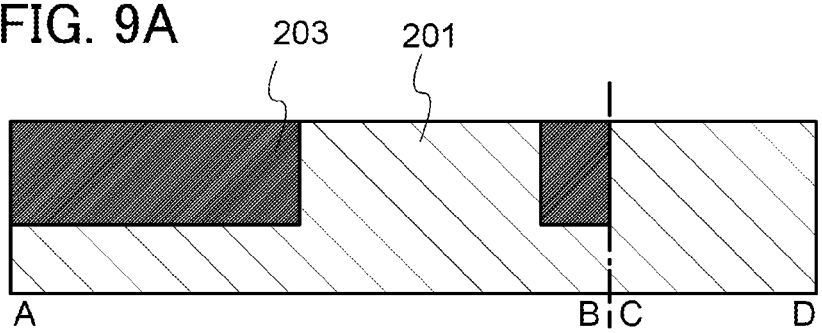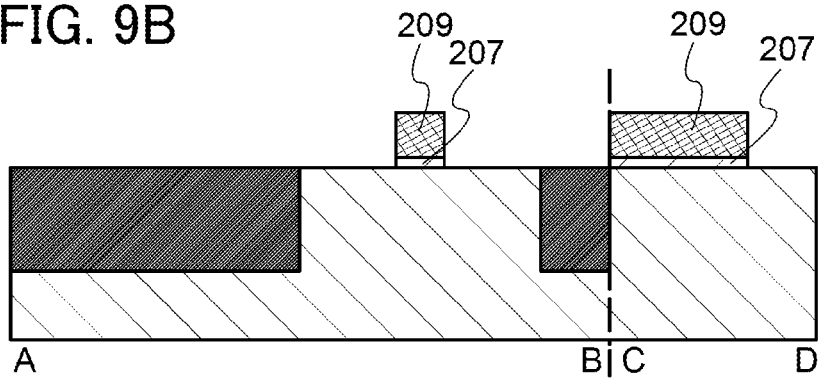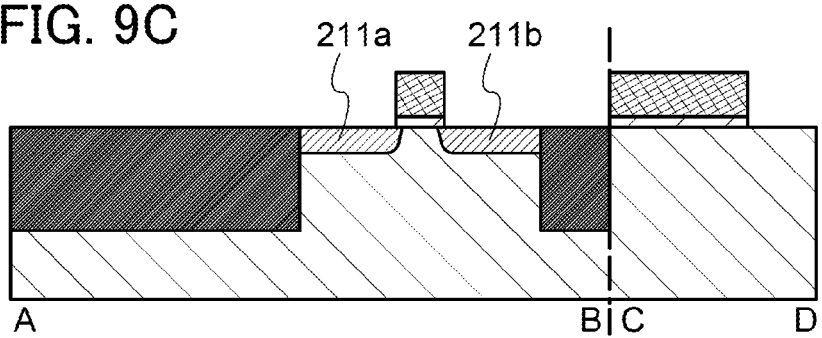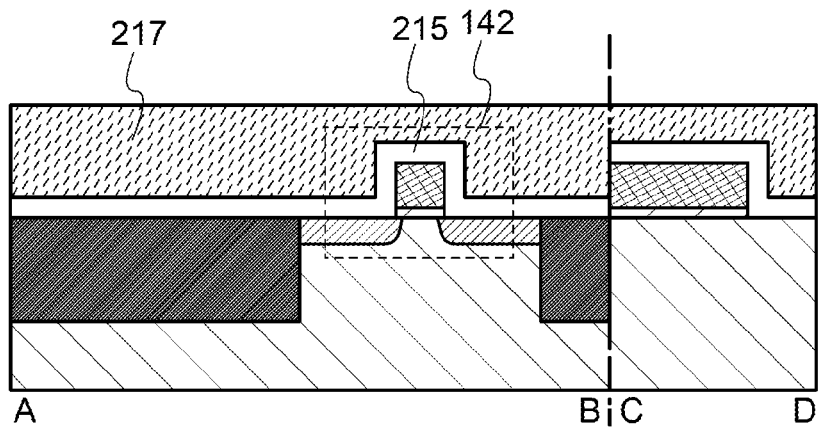

SEMICONDUCTOR DEVICE AND ALARM DEVICE

TECHNICAL FIELD

The disclosed invention relates to a semiconductor device. The disclosed invention relates to an alarm device which generates a signal related to an alarm by sensing a physical quantity relating to an abnormal situation as an example of the semiconductor device. In particular, the disclosed invention relates to an alarm device functioning as a fire alarm.

In this specification, an alarm device refers to any device which senses a physical quantity relating to an abnormal situation and transmits a signal related to an alarm, and for example, a fire alarm device (hereinafter also referred to as a fire alarm), a gas alarm device, a burglar alarm device, and a security alarm device are included in its category.

BACKGROUND ART

There are a variety of kinds of alarm devices such as fire alarm devices, gas alarm devices, burglar alarm devices, and security alarm devices. In these alarm devices, in accordance with an abnormal situation related to an alarm, a physical quantity such as the amount of light or temperature is measured selectively, and a variety of sensors are used for an alarm device in accordance with the usage.

For example, there are a variety of systems of a fire alarm device, that is a fire alarm, as a fire detection system such as a smoke detection system and a heat detection system. A typical smoke-detection fire alarm is a photoelectric one utilizing light scattering caused by smoke.

A photoelectric smoke detector has a structure in which a light-emitting element which emits light having high directivity in a circular container and a light-receiving element such as a photodiode are provided (for example, see Patent Document 1). In addition, a circuit board which controls the light-emitting element and the light-receiving element, performs arithmetic processing of measurement data, and transmits an electric signal is provided in a space isolated from a space in which smoke in the container is detected.

In the fire alarm, the light-emitting element and the light-receiving element are arranged so that light emitted from the light-emitting element does not enter the light-receiving element when no fire exists in the container. However, when smoke exists in the container, light emitted from the light-emitting element can be scattered by smoke and enter the light-receiving element. Light from the light-emitting element enters the light-receiving element, whereby the fire alarm detects a fire.

REFERENCE

Patent Document

[Patent Document 1] Japanese Published Patent Application No. H5-73785

DISCLOSURE OF INVENTION

An alarm device is a device which measures a physical quantity such as the amount of light or temperature and raises an alarm when detecting an abnormal situation. In other words, the alarm device needs to raise an alarm immediately in the case where an abnormal situation occurs; however, in the case where an abnormal situation is not detected, a physical quantity such as the amount of light or temperature does not need to be measured continuously but it is only necessary to perform measurement regularly for preparing for an abnormal situation.

However, for example, a general fire alarm measures the amount of light or temperature continuously and prepares for occurrence of smoke or heat due to a fire. Accordingly, a control microcomputer, a sensor, an amplifier, and the like provided in the fire alarm consume power continuously.

Since the fire alarms are supplied with power only from batteries in many cases, when power is consumed continuously and the batteries are drained early, an alternate battery or maintenance such as replacement of a battery is required many times. In particular, since the fire alarm is generally placed on a high place such as a ceiling, a specialist is required for maintenance in some cases. Therefore, to maintain the fire alarm, not only power consumption and battery cost but also maintenance fee such as employment cost is increased.

Against such a problem, regular measurement is performed in a fire alarm and supply of power to a circuit element in the fire alarm is stopped during an interval between measurement periods, which enables low power consumption. For example, an emission interval of a light-emitting element is made longer in a photoelectric smoke detector described in Patent Document 1, so that power consumption is reduced. However, a control circuit, an arithmetic processing circuit, and the like, such as a light-emission control circuit and a counter circuit, continuously consumes power.

In view of the above problems, in one embodiment of the disclosed invention, an object is to provide an alarm device in which low power consumption is achieved. In particular, an object is to provide an alarm device in which low power consumption of a microcomputer is achieved.

In the disclosed invention, in a microcomputer in an alarm device, supply of power to a sensor portion provided with a sensor or a CPU is allowed or stopped by a power gate controlled by a power gate controller. Accordingly, supply of power to the sensor portion or the CPU is performed in a period during which a physical quantity relating to an abnormal situation is measured and the supply of power to the sensor portion or the CPU is stopped during an interval between the measurement periods, so that power consumption can be reduced compared with the case where power is supplied continuously.

In addition, a volatile memory portion and a nonvolatile memory portion are provided in a CPU, data of the volatile memory portion is stored in the nonvolatile memory portion before the supply of power to the CPU is stopped, and the data of the nonvolatile memory portion is restored to the volatile memory portion after the supply of power to the CPU is resumed. Thus, arithmetic processing related to the measurement can be started immediately after the supply of power is resumed.

One embodiment of the disclosed invention is an alarm device including a microcomputer. The microcomputer includes a power gate controller electrically connected to a power supply line, a power gate electrically connected to the power supply line and the power gate controller, a CPU electrically connected to the power gate, and a sensor portion electrically connected to the power gate and the CPU. The power gate controller includes a timer and controls the power gate with the use of the timer. The power gate allows or stops supply of power from the power supply line to the CPU and the sensor portion, in accordance with control by the power gate controller. The sensor portion measures a physical quantity and transmits a measurement value to the CPU. The CPU performs arithmetic processing on the measurement value and transmits a signal based on the arithmetic result. The CPU includes a volatile memory portion and a nonvolatile memory portion, stores data of the volatile memory portion in the nonvolatile memory portion before the power gate stops the supply of power, and restores the data of the nonvolatile memory portion to the volatile memory portion after the power gate allows to resume the supply of power.

Another embodiment of the present invention is an alarm device including a housing provided with an inlet and a microcomputer provided in the housing. The microcomputer includes a power gate controller electrically connected to a power supply line, a power gate electrically connected to the power supply line and the power gate controller, a CPU electrically connected to the power gate, and a sensor portion electrically connected to the power gate and the CPU. The power gate controller includes a timer and controls the power gate with the use of the timer. The power gate allows or stops supply of power from the power supply line to the CPU and the sensor portion, in accordance with control by the power gate controller. The sensor portion measures a physical quantity relating to a fire and transmits a measurement value to the CPU. The CPU performs arithmetic processing on the measurement value and transmits a signal based on the arithmetic result. The CPU includes a volatile memory portion and a nonvolatile memory portion, stores data of the volatile memory portion in the nonvolatile memory portion before the power gate stops the supply of power, and restores the data of the nonvolatile memory portion to the volatile memory portion after the power gate allows to resume the supply of power.

In the above, a transistor including an oxide semiconductor film is preferably provided in the nonvolatile memory portion.

In the above, it is preferable that the alarm device further include a light-emitting element in the housing and have a structure in which the sensor portion includes a photo sensor which measures the amount of light as a physical quantity relating to a fire and the light-emitting element and the photo sensor operate when the power gate allows supply of power to the sensor portion. Further, it is preferable that light emitted from the light-emitting element be scattered by smoke entering the housing and then sensed by the photo sensor. A transistor including an oxide semiconductor film may be provided in the photo sensor.

In the above, it is preferable that the sensor portion include a temperature sensor which measures a temperature as a physical quantity relating to a fire and the temperature sensor measure the temperature when the power gate allows supply of power to the sensor portion. A semiconductor element including an oxide semiconductor and a semiconductor element including a silicon semiconductor may be provided in the temperature sensor.

Power may be supplied to the power supply line from a battery.

Note that in this specification and the like, the term "high potential H" means a potential high enough to turn on an n-channel transistor provided in a processor and turn off a p-channel transistor when the potential is supplied to gate electrodes. Further, in this specification and the like, the term "low potential L" means a potential low enough to turn off an n-channel transistor provided in a processor and turn on a p-channel transistor when the potential is supplied to gate electrodes.

Note that in this specification and the like, the term "over" or "below" does not necessarily mean that a component is placed directly on or directly under another component. For example, the expression "a gate electrode over a gate insulating layer" does not exclude the case where another component is placed between the gate insulating layer and the gate electrode.

In this specification and the like, the term "electrode" or "wiring" does not limit the function of a component. For example, an electrode can be used as part of a wiring, and the wiring can be used as part of the electrode. The term "electrode" or "wiring" can also mean a combination of a plurality of electrodes or wirings, for example.

Functions of a "source" and a "drain" are sometimes replaced with each other when a transistor of opposite polarity is used or when the direction of current flowing is changed in circuit operation, for example. Thus, in this specification and the like, the terms "source" and "drain" can be replaced with each other.

Note that in this specification and the like, the expression "electrically connected" includes the case where components are connected to each other through an "object having any electric function". Here, there is no particular limitation on an "object having any electric function" as long as electric signals can be transmitted and received between components that are connected to each other.

Examples of an "object having any electric function" include an electrode, a wiring, a switching element such as a transistor, a resistor, an inductor, a capacitor, and an element with a variety of functions.

According to one embodiment of the disclosed invention, an alarm device in which low power consumption is achieved can be provided. In particular, an alarm device in which low power consumption of a microcomputer is achieved can be provided.

BRIEF DESCRIPTION OF DRAWINGS

In the accompanying drawings:

FIG. 3 is a cross-sectional view of an alarm device according to one embodiment of the disclosed invention;

FIGS. 9A to 9D are cross-sectional views illustrating some of steps of manufacturing an alarm device according to one embodiment of the disclosed invention;

BEST MODE FOR CARRYING OUT THE INVENTION

Figure 1:
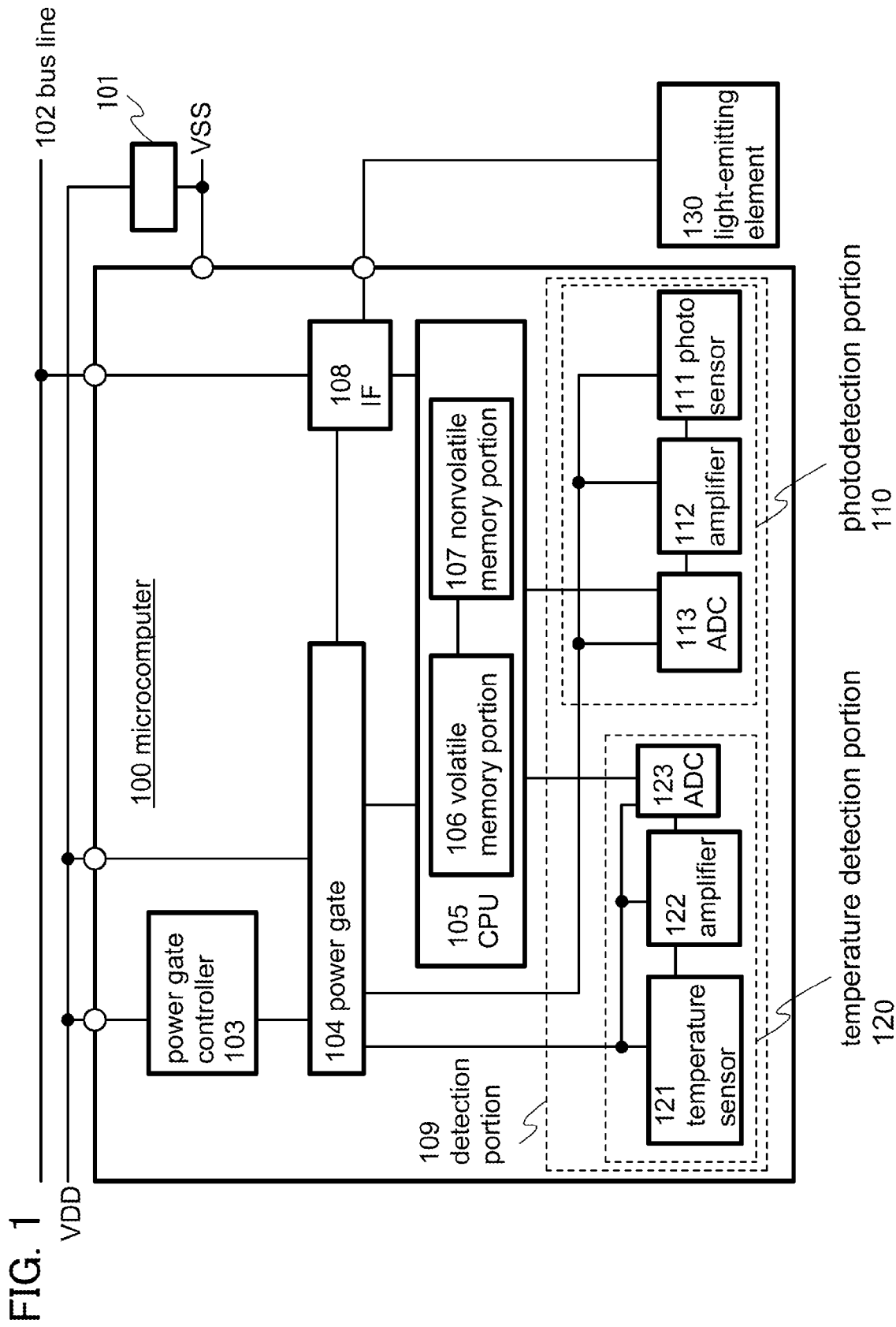
FIG. 1 is a block diagram of an alarm device according to one embodiment of the disclosed invention.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

Embodiment 1

In this embodiment, a structure and operation of an alarm device according to one embodiment of the disclosed invention are described. As an example of the alarm device, a structure and operation of a fire alarm are described with reference to FIG. 1, FIGS. 2A and 2B, FIG. 3, FIGS. 4A to 4C, FIG. 5, and FIG. 6.

A fire alarm in this specification refers to any device which raises an alarm over fire occurrence instantly, and for example, a residential fire alarm, an automatic fire alarm system, and a fire detector used for the automatic fire alarm system are included in its category.

Figure 2A:
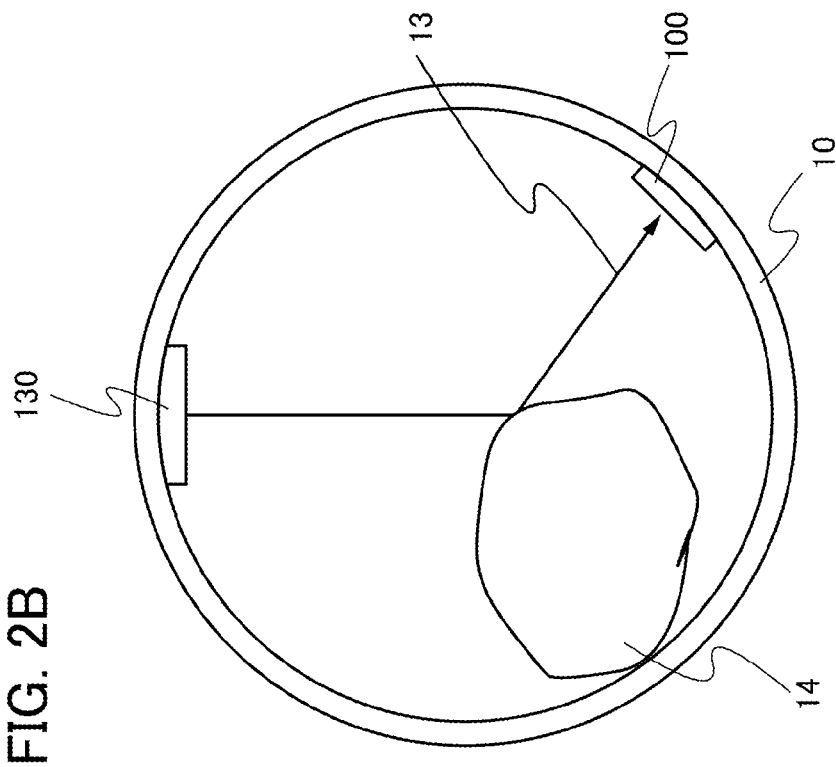
FIGS. 2A and 2B are plan views of an alarm device according to one embodiment of the disclosed invention.
Figure 2B:
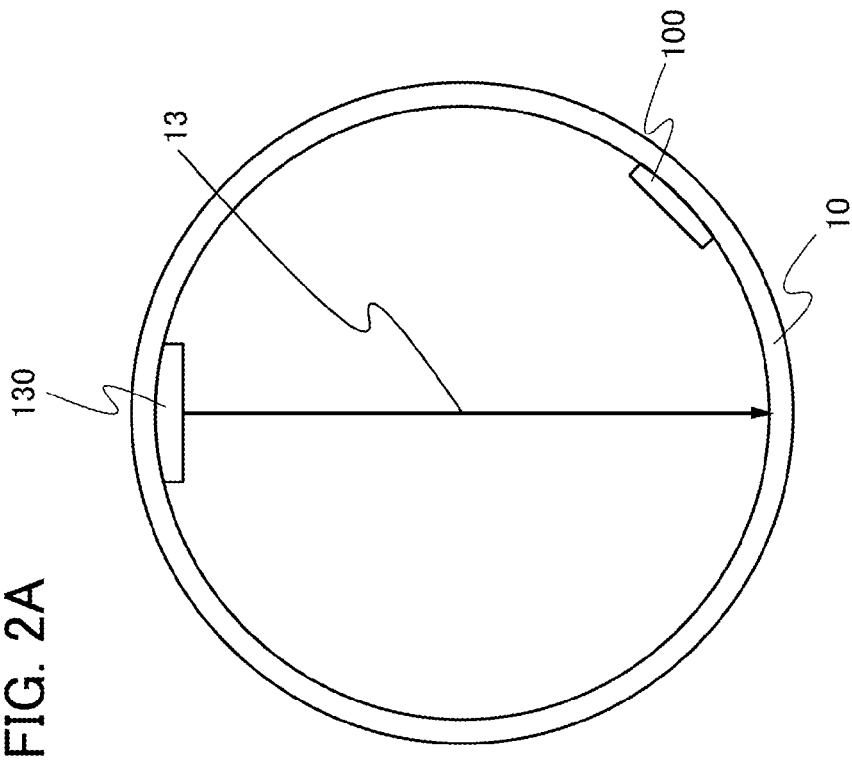

The structure of the alarm device according to one embodiment of the disclosed invention is illustrated in a block diagram of FIG. 1. FIGS. 2A and 2B are plan views of the alarm device, and FIG. 3 is a cross-sectional view thereof. The plan view in FIG. 2A illustrates the alarm device in a state where smoke does not enter a housing 10, and the plan view in FIG. 2B illustrates the alarm device in a state where smoke enters the housing 10.

As illustrated in FIG. 1, the alarm device includes at least a microcomputer 100. Here, the microcomputer 100 is provided in the housing 10 including an inlet 12. The microcomputer 100 includes a power gate controller 103 electrically connected to a high potential power supply line VDD, a power gate 104 electrically connected to the high potential power supply line VDD and the power gate controller 103, a CPU 105 electrically connected to the power gate 104, and a sensor portion 109 electrically connected to the power gate 104 and the CPU 105. Further, the CPU 105 includes a volatile memory portion 106 and a nonvolatile memory portion 107.

The CPU 105 is electrically connected to a bus line 102 through an interface 108. The interface 108 is also electrically connected to the power gate 104, similarly to the CPU 105. As a bus standard of the interface 108, an I²C bus can be used, for example. A light-emitting element 130 electrically connected to the power gate 104 through the interface 108 is provided in the alarm device described in this embodiment.

The light-emitting element 130 is preferably an element which emits light with high directivity, and for example, an organic EL element, an inorganic EL element, or a light-emitting diode (LED) can be used.

The power gate controller 103 includes a timer and controls the power gate 104 with the use of the timer. The power gate 104 allows or stops supply of power from the high potential power supply line VDD to the CPU 105, the sensor portion 109, and the interface 108, in accordance with the control by the power gate controller 103. Here, as an example of the power gate 104, a switching element such as a transistor can be given.

With the use of the power gate controller 103 and the power gate 104, power is supplied to the sensor portion 109, the CPU 105, and the interface 108 in a period during which the amount of light, temperature, or the like is measured, and supply of power to the sensor portion 109, the CPU 105, and the interface 108 can be stopped during an interval between measurement periods. The alarm device operates in such a manner, whereby power consumption can be reduced compared with the case where power is continuously supplied to the above structures.

In the case where a transistor is used as the power gate 104, it is preferable to use a transistor which has extremely low off-state current and is used for the nonvolatile memory portion 107 to be described later, for example, a transistor including an oxide semiconductor. With the use of such a transistor, leakage current can be reduced when supply of power is stopped by the power gate 104, so that power consumption can be reduced.

A direct-current power source 101 may be provided in the alarm device described in this embodiment so that power is supplied from the direct-current power source 101 to the high potential power supply line VDD. An electrode of the direct-current power source 101 on a high potential side is electrically connected to the high potential power supply line VDD, and an electrode of the direct-current power source 101 on a low potential side is electrically connected to a low potential power supply line VSS. The low potential power supply line VSS is electrically connected to the microcomputer 100. Here, the high potential power supply line VDD is supplied with a high potential H. Further, the low potential power supply line VSS is supplied with a low potential L, e.g., a ground potential (GND).

In the case where a battery is used as the direct-current power source 101, for example, a battery case including an electrode electrically connected to the high potential power supply line VDD, an electrode electrically connected to the low potential power supply line VSS, and a housing which can hold the battery, is provided in the housing 10. Note that the alarm device described in this embodiment does not necessarily include the direct-current power source 101 and may have, for example, a structure in which power is supplied from an alternate-current power source provided outside the alarm device through a wiring.

As the above battery, a secondary battery such as a lithium ion secondary battery (also called a lithium ion storage battery or simply a lithium ion battery) can be used. Further, a solar battery is preferably provided to charge the secondary battery.

The sensor portion 109 measures a physical quantity relating to an abnormal situation and transmits a measurement value to the CPU 105. A physical quantity relating to an abnormal situation depends on the usage of the alarm device, and in an alarm device functioning as a fire alarm, a physical quantity relating to a fire is measured. Accordingly, the sensor portion 109 includes a photosensor portion 110 which measures the amount of light as a physical quantity relating to a fire and senses smoke and a temperature sensor portion 120 which measures a temperature as a physical quantity relating to a fire and senses heat. That is, an alarm device including the photosensor portion 110 and the temperature sensor portion 120 functions as a smoke-sensing and heat-sensing fire alarm.

The photosensor portion 110 includes a photo sensor 111 electrically connected to the power gate 104, an amplifier 112 electrically connected to the power gate 104, and an AD converter 113 electrically connected to the power gate 104 and the CPU 105. The photo sensor 111, the amplifier 112, and the AD converter 113 which are provided in the photosensor portion 110 and the light-emitting element 130 operate when the power gate 104 allows supply of power to the photosensor portion 110. Here, as the photo sensor 111, one provided with a photoelectric conversion element such as a photodiode can be used, for example.

Here, how the alarm device functioning as a fire alarm detects smoke is described with reference to FIGS. 2A and 2B and FIG. 3. As illustrated in FIGS. 2A and 2B and FIG. 3, the alarm device functioning as a fire alarm includes the housing 10 in which central axes align on one surface of a first cylindrical portion and a second cylindrical portion having a radius smaller than that of the first cylindrical portion is provided. The inlet 12 is provided on a side surface of the second cylindrical portion of the housing 10, and the microcomputer 100 and the light-emitting element 130 are provided in contact with an inner wall of the first cylindrical portion of the housing 10. Note that the microcomputer 100 and the light-emitting element 130 are provided so as not to face each other with respect to the center point of the bottom surface of the first cylindrical portion. Note that the housing 10 of the alarm device according to this embodiment is not limited to this structure and can be changed as appropriate depending on the usage of the alarm device, an installation requirement, or the like.

In FIGS. 2A and 2B, a solid arrow denotes light. As illustrated in FIG. 2A, although the light-emitting element 130 emits light 13 with high directivity, the light-emitting element 130 and the microcomputer 100 are not provided to face each other; thus, light 13 emitted from the light-emitting element 130 is emitted in a direction different from the direction toward the microcomputer 100. In other words, when there is no smoke in the housing 10, light 13 emitted from the light-emitting element 130 does not enter the photo sensor 111 in the microcomputer 100.

However, as illustrated in FIG. 2B, when smoke 14 enters the inside of the housing 10 through the inlet 12, light 13 emitted from the light-emitting element 130 is scattered by the smoke 14, so that the light 13 enters the photo sensor 111 in the microcomputer 100. When the light 13 enters the photo sensor 111, a potential in accordance with the amount of received light 13 is input from the photo sensor 111 to the amplifier 112, a potential amplified by the amplifier 112 is input to the AD converter 113, and a potential converted from an analog signal to a digital signal in the AD converter 113 is transmitted to the CPU 105. In such a manner, the alarm device including the photosensor portion 110 detects smoke relating to a fire.

Further the temperature sensor portion 120 includes a temperature sensor 121 electrically connected to the power gate 104, an amplifier 122 electrically connected to the power gate 104, and an AD converter 123 electrically connected to the power gate 104 and the CPU 105. The temperature sensor 121, the amplifier 122, and the AD converter 123 which are provided in the temperature sensor portion 120 operate when the power gate 104 allows supply of power to the temperature sensor portion 120. Here, for example, a thermistor (resistive element of which resistance varies depending on temperature) or an IC temperature sensor (which uses a temperature characteristics of a base-emitter voltage of an NPN transistor) can be used as the temperature sensor 121. The temperature sensor 121 can be formed using two or more kinds of semiconductor elements with different temperature characteristics.

When a temperature value is input to the temperature sensor 121, a potential in accordance with the input temperature value is input to the amplifier 122, a potential amplified by the amplifier 122 is input to the AD converter 123, and a potential converted from an analog signal to a digital signal in the AD converter 123 is transmitted to the CPU 105. In such a manner, the alarm device including the temperature sensor portion 120 detects heat relating to a fire.

As described above, when the photosensor portion 110 which detects smoke and the temperature sensor portion 120 which detects heat are provided in the sensor portion 109, the accuracy of detection of a fire can be increased.

Note that in the alarm device described in this embodiment, the photosensor portion 110 and the temperature sensor portion 120 are not necessarily provided as the sensor portion 109. For example, either the photosensor portion 110 or the temperature sensor portion 120 may be provided. Alternatively, neither the photosensor portion 110 nor the temperature sensor portion 120 is necessary to be provided in sensor portion 109. In this case, a sensor which measures a physical quantity, not the amount of light and temperature, is provided as the sensor portion 109, and a sensor which measures an ultraviolet ray, an infrared ray, carbon monoxide, or the like can be provided. For example, in the case where an infrared ray is sensed, a photoelectric conversion element using germanium having a light absorption wavelength different from that of silicon can be used.

Note that in the case where the photosensor portion 110 is not provided, the light-emitting element 130 does not need to be provided.

The alarm device according to this embodiment is not limited to a fire alarm and can be used as various alarm devices, for example, a gas alarm device, a burglar alarm device, and a security alarm device. In the case where the alarm device described in this embodiment is used as an alarm device which is not a fire alarm, a sensor which can measure a physical quantity in accordance with an abnormal situation to be checked by the alarm device is provided in the sensor portion 109.

Further, the alarm device according to this embodiment has a structure in which the sensor portion 109 including the temperature sensor portion 120 and the photosensor portion 110 is provided in the microcomputer 100; however, the alarm device according to the present invention is not limited thereto. A structure in which the sensor portion 109 is provided outside the microcomputer 100 and the sensor portion 109 and the microcomputer 100 are electrically connected to each other through a wiring or the like may be employed.

Alternatively, only part of the sensor portion 109 may be provided outside the microcomputer 100. For example, the microcomputer 100 according to this embodiment may have a structure in which the AD converter 113 in the photosensor portion 110 and the AD converter 123 in the temperature sensor portion 120 are provided inside the microcomputer 100, and the photo sensor 111 and the amplifier 112 in the photosensor portion 110 and the temperature sensor 121 and the amplifier 122 in the temperature sensor portion 120 are provided outside the microcomputer 100.

The CPU 105 performs arithmetic processing on a measurement value and transmits a signal based on the arithmetic result. The signal transmitted from the CPU 105 is output to the bus line 102 through the interface 108. In the case where the alarm device according to this embodiment is used as a fire detector of an automatic fire alarm system, the signal is transmitted to a receiver of the automatic fire alarm system and the receiver raises an alarm. Further, in the case where the alarm device according to this embodiment is used as a residential fire alarm, the signal is transmitted to the alarm device electrically connected to the CPU 105 instead of the bus line 102 and an alarm is raised. Here, as a way of raising an alarm by the alarm device, voice, beep sound, light emission, smell, or the like can be used.

Further, transmission of a signal to the above receiver or alarm device is not necessarily performed through a wire and may be performed wirelessly. For example, the alarm device may be provided with a wireless chip.

Further, the CPU 105 includes the volatile memory portion 106 and the nonvolatile memory portion 107. Before the power gate 104 stops supply of power, data of the volatile memory portion 106 is stored in the nonvolatile memory portion 107, and after the power gate 104 allows the supply of power, the data of the nonvolatile memory portion 107 is restored to the volatile memory portion 106.

The volatile memory portion 106 includes a plurality of volatile memory elements and also includes a circuit relating to control thereof and the like. Note that access speed of the volatile memory element included in the volatile memory portion 106 is higher than at least that of a nonvolatile memory element included in the nonvolatile memory portion 107 to be described later.

A semiconductor material used for a transistor included in the volatile memory element is not particularly limited. However, the semiconductor material preferably has a band gap width different from that of a semiconductor material used for a transistor with low off-state current in the nonvolatile memory element to be described later. Such a semiconductor material can be, for example, silicon, germanium, silicon germanium, or gallium arsenide and is preferably single crystal. In order to increase the speed of processing data, it is preferable to use, for example, a transistor with high switching speed, such as a transistor formed using single crystal silicon.

The nonvolatile memory portion 107 includes a plurality of nonvolatile memory elements and also includes a circuit relating to control thereof and the like. The nonvolatile memory element is electrically connected to a node holding electric charge corresponding to data of the volatile memory element and is used for storing data from the volatile memory element in a period during which power is not supplied. Accordingly, the nonvolatile memory element included in the nonvolatile memory portion 107 has a longer data holding time than at least the volatile memory element to which power is not supplied.

Figure 4A:
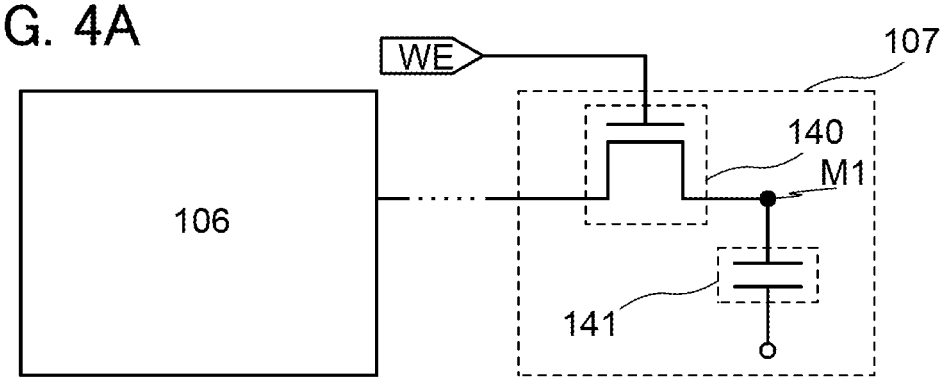
FIGS. 4A to 4C each are an equivalent circuit diagram of part of an alarm device according to one embodiment of the disclosed invention.
Figure 4B:
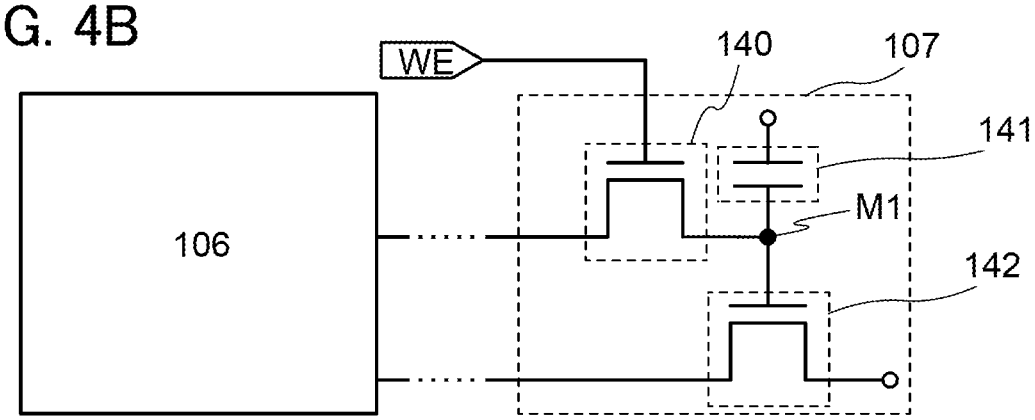
Figure 4C:
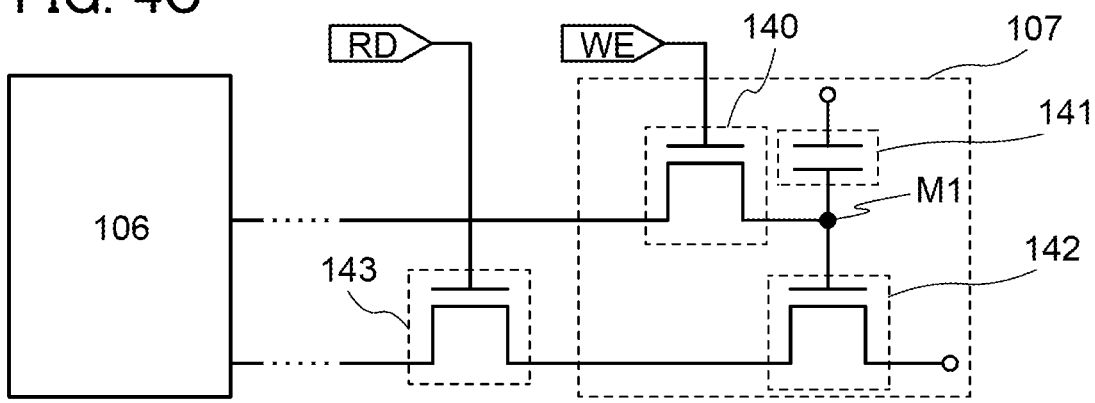

Here, examples of a structure of the nonvolatile memory element in the nonvolatile memory portion 107 are described using circuit diagrams in FIGS. 4A to 4C.

The nonvolatile memory portion 107 in FIG. 4A includes a transistor 140 and a capacitor 141 and is electrically connected to the volatile memory portion 106 through the transistor 140. Note that in this embodiment, the transistor 140 is an n-channel transistor; however, a p-channel transistor may be used as appropriate. In such a case, a potential supplied to a gate electrode is inverted as appropriate.

Specifically, a source electrode (or a drain electrode) of the transistor 140 is electrically connected to a node holding electric charge corresponding to data of the volatile memory portion 106. The drain electrode (or the source electrode) of the transistor 140 is electrically connected to one electrode of the capacitor 141 (hereinafter the drain electrode of the transistor 140 is referred to as a node M1 in some cases). A write control signal WE is supplied to the gate electrode of the transistor 140, and the transistor 140 is turned on or off in accordance with the potential of the write control signal WE. A predetermined potential is supplied to the other electrode of the capacitor 141. Here, the predetermined potential is, for example, a ground potential (GND). By providing the capacitor 141 in this manner, much electric charge can be held in the node M1, so that data holding characteristics can be improved.

The transistor 140 is preferably a transistor with extremely low off-state current. The transistor with extremely low off-state current preferably includes, in a channel formation region, a wide band gap semiconductor having a wider band gap and lower intrinsic carrier density than single crystal silicon. For example, the band gap of the wide band gap semiconductor is more than 1.1 eV, preferably 2.5 eV or more and 4 eV or less, more preferably 3 eV or more and 3.8 eV or less. For example, as the wide band gap semiconductor, a compound semiconductor such as silicon carbide (SiC) or gallium nitride (GaN), an oxide semiconductor formed using metal oxide such as an In—Ga—Zn—O-based oxide semiconductor, or the like can be used. Alternatively, since a transistor including amorphous silicon, microcrystalline silicon, or the like can have lower off-state current than a transistor including single crystal silicon, the transistor 140 may employ amorphous silicon, microcrystalline silicon, or the like.

Here, the band gap of single crystal silicon is approximately 1.1 eV, and even in a state where there is no carrier caused by a donor or an acceptor (i.e., even in the case of an intrinsic semiconductor), the concentration of thermally excited carriers is approximately $1\times10^{11}$ cm$^{-3}$. The band gap of the In—Ga—Zn—O-based oxide semiconductor which is the wide band gap semiconductor is approximately 3.2 eV and the concentration of thermally excited carriers is approximately $1\times10^{-7}$ cm$^{-3}$. The off-state resistance (resistance between a source and a drain of a transistor in an off state) of a transistor is inversely proportional to the concentration of thermally excited carriers in the channel formation region. Accordingly, the resistivity of the In—Ga—Zn—O-based oxide semiconductor at the time when the transistor is off is 18 orders of magnitude higher than that of silicon.

By using such a wide band gap semiconductor for the transistor 140, for example, off-state current (per unit channel width (1 μm), here) at room temperature (25° C.) is 100 zA (1 zA (zeptoampere) is $1\times10^{-21}$ A) or lower, preferably 10 zA or lower.

For example, when the off-state current of the transistor 140 at room temperature (25° C.) (per unit channel width (1 μm), here) is 10 zA or lower, data can be held for $10^4$ seconds or longer. Needless to say, the holding time depends on the characteristics of the transistor 140, a capacitance value of a capacitor in the electrode of the transistor 140 and the like.

In this embodiment, a transistor including an oxide semiconductor whose off-state current is extremely low is used as the transistor 140.

When data is stored from the volatile memory portion 106, by turning on the transistor 140 by supply of the high potential H as the write control signal WE, the potential of the node holding electric charge corresponding to data of the volatile memory portion 106 is supplied to the node M1. After that, by turning off the transistor 140 by supply of the low potential L as the write control signal WE, electric charge supplied to the node M1 is held. Here, since the off-state current of the transistor 140 is extremely low, electric charge in the node M1 is held for a long time.

When data is restored to the volatile memory portion 106, by turning on the transistor 140 by supply of the high potential H as the write control signal WE, the potential of the node M1 is supplied to the node holding electric charge corresponding to data of the volatile memory portion 106.

By using a wide band gap semiconductor or the like for the transistor 140, the off-state current of the transistor 140 can be extremely low. Thus, by turning off the transistor 140, the potential of the node M1 can be held for an extremely long time. With such a structure, the nonvolatile memory portion 107 can be used as a nonvolatile memory element capable of holding data without supply of power.

As illustrated in FIG. 4B, the nonvolatile memory portion 107 may include a transistor 142 in addition to the components in FIG. 4A. A gate electrode of the transistor 142 is electrically connected to the node M1. A drain electrode (or a source electrode) of the transistor 142 is electrically connected to the node holding electric charge corresponding to data of the volatile memory portion 106. A predetermined potential is supplied to the source electrode (or the drain electrode) of the transistor 142.

In the nonvolatile memory portion 107 in FIG. 4B, the state of the transistor 142 depends on a potential held in the node M1 in the storage of data. In other words, the transistor 142 is turned on when the high potential H is supplied in the storage of data, and the transistor 142 is turned off when the low potential L is supplied in the storage of data.

In restorage of data, the potential of the drain electrode of the transistor 142 is supplied to the node holding electric charge corresponding to data of the volatile memory portion 106. In other words, when the high potential H is supplied to the node M1 in the storage of data, the transistor 142 is on, and the potential of the source electrode of the transistor 142 is supplied to the volatile memory portion 106. Further, when the low potential L is supplied to the node M1 in the storage of data, the transistor 142 is off, and the potential of the source electrode of the transistor 142 is not supplied to the volatile memory portion 106.

In order to increase the speed of reading data, it is preferable to use a transistor that is similar to the transistor used for the volatile memory element as the transistor 142.

Note that the source electrode of the transistor 142 and the other electrode of the capacitor 141 may have the same potential or different potentials. The source electrode of the transistor 142 and the other electrode of the capacitor 141 may be electrically connected to each other. Further, the capacitor 141 is not necessarily provided. For example, in the case where the parasitic capacitance of the transistor 142 is high, the parasitic capacitance can be used instead of the capacitor 141.

Here, the drain electrode of the transistor 140 and the gate electrode of the transistor 142 (i.e., the node M1) have the same effect as a floating gate of a floating-gate transistor used as a nonvolatile memory element. However, since data can be directly rewritten by turning on or off the transistor 140, injection of electric charge into a floating gate and extraction of electric charge from the floating gate with the use of high voltage are not necessary. In other words, in the nonvolatile memory portion 107, high voltage needed for writing or erasing data in a conventional floating gate transistor is not necessary. Thus, by using the nonvolatile memory portion 107 in this embodiment, power consumption needed for storage of data can be reduced.

For similar reasons, a decrease in operation speed due to data writing or data erasing can be reduced; thus, the nonvolatile memory portion 107 can operate at high speed. Further, for similar reasons, the problem of deterioration of a gate insulating film (a tunnel insulating film) that is pointed out in a conventional floating gate transistor does not exist. In other words, unlike in a conventional floating gate transistor, the nonvolatile memory portion 107 described in this embodiment has no limitation on the number of writings in principle. From the above, the nonvolatile memory portion 107 can be adequately used as a memory device that needs many rewritings and high-speed operation, such as a register.

As illustrated in FIG. 4C, the nonvolatile memory portion 107 may include a transistor 143 in addition to the components in FIG. 4B. A read control signal RD is supplied to a gate electrode of the transistor 143. A drain electrode (or a source electrode) of the transistor 143 is electrically connected to the node holding electric charge corresponding to data of the volatile memory portion 106. The source electrode (or the drain electrode) of the transistor 143 is electrically connected to the drain electrode of the transistor 142.

Here, the read control signal RD is a signal for supplying the high potential H to the gate electrode of the transistor 143 at the time of the restorage of data. In this case, the transistor 143 can be turned on. Accordingly, at the time of the restorage of data, a potential based on the on state or off state of the transistor 142 can be supplied to the node holding electric charge corresponding to data of the volatile memory portion 106.

Note that in order to increase the speed of reading data, it is preferable to use a transistor that is similar to the transistor used for the volatile memory element in the volatile memory portion 106 as the transistor 143.

Figure 5:
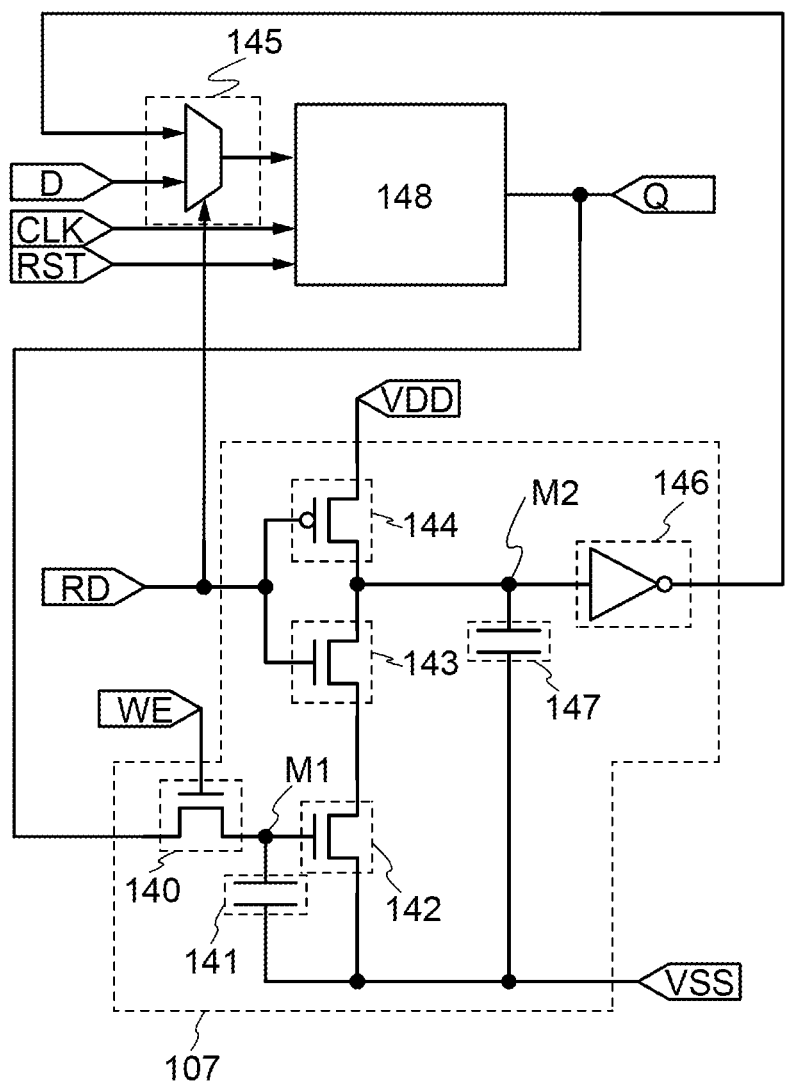
FIG. 5 is an equivalent circuit diagram of part of an alarm device according to one embodiment of the disclosed invention.

FIG. 5 shows an example of a circuit configuration of a nonvolatile register which can hold 1-bit data and includes the nonvolatile memory portion 107 in FIG. 4C. Note that in FIG. 5, the same reference numerals are used for the same components as those in FIG. 4C.

The register in FIG. 5 includes a flip-flop 148, the nonvolatile memory portion 107, and a selector 145. In the register in FIG. 5, the flip-flop 148 is provided as the volatile memory portion 106 in FIG. 4C.

The flip-flop 148 is supplied with a reset signal RST, a clock signal CLK, and a data signal. The flip-flop 148 has a function of holding data of a data signal D that is input in accordance with the clock signal CLK and outputting the data as a data signal Q.

The nonvolatile memory portion 107 is supplied with the write control signal WE, the read control signal RD, and the data signal Q.

The nonvolatile memory portion 107 has a function of storing data of an inputted data signal Q in accordance with the write control signal WE and outputting the stored data as the data signal Q in accordance with the read control signal RD.

The selector 145 selects the data signal D or the data signal Q output from the nonvolatile memory portion 107 and inputs the selected signal to the flip-flop 148 in accordance with the read control signal RD.

Further, as illustrated in FIG. 5, the transistor 140 and the capacitor 141 are provided in the nonvolatile memory portion 107.

The transistor 140 is an n-channel transistor. One of a source electrode and a drain electrode of the transistor 140 is electrically connected to an output terminal of the flip-flop 148. The transistor 140 has a function of controlling holding a data signal output from the flip-flop 148 in accordance with the write control signal WE.

The transistor 140 can be a transistor which includes an oxide semiconductor and has low off-state current, as in the structure in FIG. 4C.

One of a pair of electrodes of the capacitor 141 is electrically connected to the other of the source electrode and the drain electrode of the transistor 140 (hereinafter the node is referred to as a node M1 in some cases). The low potential L is supplied to the other of the pair of electrodes of the capacitor 141. The capacitor 141 has a function of holding electric charge based on data of the stored data signal D in the node M1. Since the off-state current of the transistor 140 is extremely low, the electric charge in the node M1 is held and thus the data is held even when supply of the power supply voltage is stopped.

A transistor 144 is a p-channel transistor. One of a source electrode and a drain electrode of the transistor 144 is supplied with the high potential H. A gate electrode of the transistor 144 is supplied with the read control signal RD. The difference between the high potential H and the low potential L is a power supply voltage.

The transistor 143 is an n-channel transistor. One of the source electrode and the drain electrode of the transistor 143 is electrically connected to the other of the source electrode and the drain electrode of the transistor 144 (hereinafter the node is referred to as the node M2 in some cases). The gate electrode of the transistor 143 is supplied with the read control signal RD.

The transistor 142 is an n-channel transistor. One of the source electrode and the drain electrode of the transistor 142 is electrically connected to the other of the source electrode and the drain electrode of the transistor 143, and the other thereof is supplied with the low potential L.

An input terminal of an inverter 146 is electrically connected to the one of the source electrode and the drain electrode of the transistor 144. An output terminal of the inverter 146 is electrically connected to an input terminal of the selector 145.

One of a pair of electrodes of a capacitor 147 is electrically connected to the input terminal of the inverter 146, and the other thereof is supplied with the low potential L. The capacitor 147 has a function of holding electric charge based on data of a data signal input to the inverter 146.

In the register having the above-described structure in FIG. 5, when data is stored from the flip-flop 148, the transistor 140 is turned on by supply of the high potential H as the write control signal WE, so that electric charge based on data of the data signal Q in the flip-flop 148 is supplied to the node M1. After that, by turning off the transistor 140 by supply of the low potential L as the potential of the write control signal WE, electric charge supplied to the node M1 is held. While the low potential L is supplied as the potential of the read control signal RD, the transistor 143 is turned off and the transistor 144 is turned on, so that the potential of the node M2 becomes the high potential H.

When data is restored from the flip-flop 148, by supply of the high potential H as the read control signal RD, the transistor 144 is turned off and the transistor 143 is turned on, so that a potential based on the electric charge held in the node M1 is supplied to the node M2. In the case where electric charge corresponding to the high potential H of the data signal Q is held in the node M1, the transistor 142 is turned on, the low potential L is supplied to the node M2, and the high potential H is restored to the flip-flop 148 through the inverter 146. Alternatively, in the case where electric charge corresponding to the low potential L of the data signal Q is held in the node M1, the transistor 142 is turned off, the high potential H in the node M2 when the low potential L is supplied is held as the potential of the read control signal RD, and the low potential L is restored to the flip-flop 148 through the inverter 146.

By provision of the volatile memory portion 106 and the nonvolatile memory portion 107 in the CPU 105 as described above, data can be stored from the volatile memory portion 106 in the nonvolatile memory portion 107 before supply of power to the CPU 105 is stopped and data can be quickly restored from the nonvolatile memory portion 107 to the volatile memory portion 106 when the supply of power to the CPU 105 is resumed.

By storing and restoring data in such a manner, the CPU 105 does not need to be started up from a state where the volatile memory portion 106 is initialized every time the supply of power is stopped; thus, after the supply of power is resumed, the CPU 105 can start arithmetic processing relating to measurement immediately.

In the above, the structure of the nonvolatile memory portion 107 is not limited to the structures in FIGS. 4A to 4C and FIG. 5. For example, a phase change memory (PCM), a resistance random access memory (ReRAM), a magnetoresistive random access memory (MRAM), a ferroelectric random access memory (FeRAM), or a flash memory can be used.

A plurality of volatile memory elements in the volatile memory portion 106 can be included in, for example, a register such as a buffer register or a general-purpose register. A cache memory including a static random access memory (SRAM) or the like can also be provided in the volatile memory portion 106. The register and cache memory can store data in the nonvolatile memory portion 107.

Figure 6:
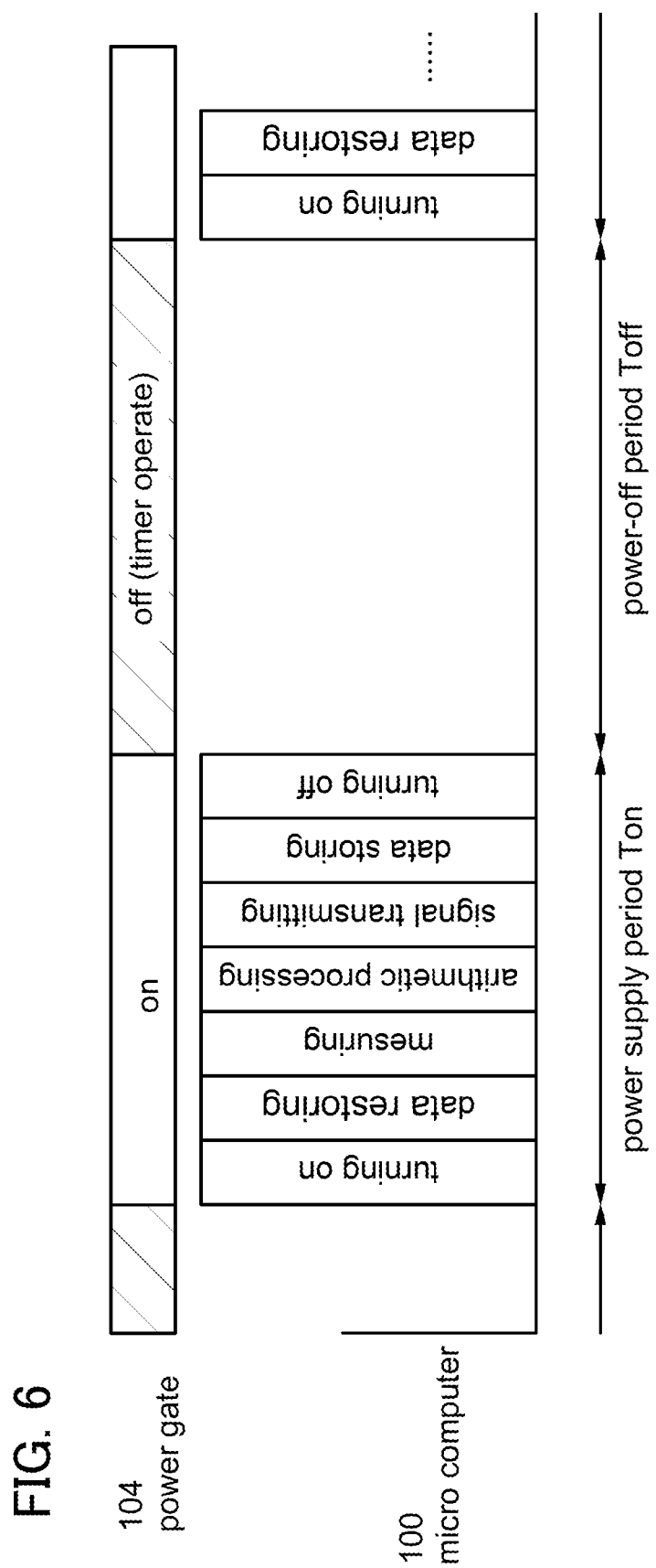
FIG. 6 is a diagram showing operation of an alarm device according to one embodiment of the disclosed invention.

Next, operation of the alarm device according to this embodiment is described with reference to FIG. 6. FIG. 6 is a diagram showing the state of the power gate 104 and the operation of the microcomputer 100 in a power supply period Ton and a power-off period Toff.

The alarm device according to this embodiment operates in the following divided periods: the power supply period Ton during which the power gate 104 is in an on state and power is supplied to the CPU 105, the sensor portion 109, and the interface 108; and the power-off period Toff during which the power gate 104 is in an off state and supply of power to the CPU 105, the sensor portion 109, and the interface 108 is stopped.

The operation of the microcomputer 100 in the power supply period Ton during which the power gate 104 is in an on state is described. First, by control by the power gate controller 103, the power gate 104 is turned on and power is on. At this time, supply of power to the CPU 105, the sensor portion 109, and the interface 108 from the high potential power supply line VDD is started through the power gate 104. In the case where the photosensor portion 110 is provided in the sensor portion 109, supply of power to the photo sensor 111, the amplifier 112, the AD converter 113, and the light-emitting element 130 is also started. Further, in the case where the temperature sensor portion 120 is provided in the sensor portion 109, supply of power to the temperature sensor 121, the amplifier 122, and the AD converter 123 is also started.

Note that power is not necessarily supplied to the CPU 105, the sensor portion 109, and the interface 108 at the same time. For example, at the timing of the use of the CPU 105, the photosensor portion 110, the temperature sensor portion 120, and the interface 108, power can be supplied at different timings.

Next, in the CPU 105, data is restored from the nonvolatile memory portion 107 to the volatile memory portion 106. The above description of FIGS. 4A to 4C and FIG. 5 can be referred to for details of the storage of data. By performing the restorage of data in the CPU 105 in such a manner, the CPU 105 does not need to be started up from the state where the volatile memory portion 106 is initialized every time the power supply period Ton begins; thus, after the supply of power is resumed, the CPU 105 can start arithmetic processing immediately.

Next, in the sensor portion 109, a physical quantity relating to an abnormal situation is measured. In the alarm device functioning as a fire alarm, in the photosensor portion 110, light from the light-emitting element 130 is received by the photo sensor 111, a potential in accordance with the amount of received light is input from the photo sensor 111 to the amplifier 112, and a potential amplified by the amplifier 112 is input to the AD converter 113. A potential converted from an analog signal to a digital signal in the AD converter 113 is transmitted to the CPU 105 as a measurement value obtained by the photosensor portion 110.

Further, in the temperature sensor portion 120, a potential in accordance with a temperature is input from the temperature sensor 121 to the amplifier 122 and a potential amplified by the amplifier 122 is input to the AD converter 123. A potential converted from an analog signal to a digital signal in the AD converter 123 is transmitted to the CPU 105.

Next, in the CPU 105, arithmetic processing is performed on the measurement value transmitted from the sensor portion 109. For example, in the arithmetic processing, whether a fire occurs or not is determined based on the measurement value transmitted from the sensor portion 109 and a fire occurrence signal or a no fire signal is transmitted.

Next, a signal based on the arithmetic result is transmitted from the CPU 105 to the bus line 102 through the interface 108. In the case where the alarm device according to this embodiment is used as a fire detector of an automatic fire alarm system, the signal is transmitted to a receiver of the automatic fire alarm system, and when the signal is a fire occurrence signal, the receiver raises an alarm.

Further, in the case where the alarm device according to this embodiment is used as a residential fire alarm, the signal is transmitted to the alarm device electrically connected to the CPU 105 instead of the bus line 102, and when the signal is a fire occurrence signal, the alarm device raises an alarm.

Next, in the CPU 105, data is stored from the volatile memory portion 106 to the nonvolatile memory portion 107. The above description of FIGS. 4A to 4C and FIG. 5 can be referred to for details of the storage of data.

Next, by control by the power gate controller 103, the power gate 104 is turned off and power is off. At this time, supply of power to the CPU 105, the sensor portion 109, and the interface 108 from the high potential power supply line VDD is stopped through the power gate 104. In the case where the photosensor portion 110 is provided in the sensor portion 109, supply of power to the photo sensor 111, the amplifier 112, the AD converter 113, and the light-emitting element 130 is also stopped. Further, in the case where the temperature sensor portion 120 is provided in the sensor portion 109, supply of power to the temperature sensor 121, the amplifier 122, and the AD converter 123 is also stopped.

Note that supply of power to the CPU 105, the sensor portion 109, and the interface 108 is not necessarily stopped at the same time. For example, at the timing of the end of the use of the CPU 105, the photosensor portion 110, the temperature sensor portion 120, and the interface 108, supply of power can be stopped at different timings.

When the power supply period Ton ends as described above, the power-off period Toff begins. Here, the power gate controller 103 makes its timer operate and starts measuring time when the power gate 104 is turned off. After passage of a certain period of time is measured by the timer, the power gate controller 103 turns on the power gate 104 again, and the power supply period Ton is resumed. Note that the period measured by the timer may be changed with software.

The alarm device operates in the power supply period Ton and the power-off period Toff with the use of the power gate controller 103 and the power gate 104 in such a manner, whereby power consumption can be reduced compared with the case where power is continuously supplied. For example, it is sufficient that measurement for fire detection is performed every 30 seconds, and the power supply period Ton takes 0.1 second or less; thus, the power-off period Toff takes 29.9 seconds. Since the power-off period Toff can be longer than the power supply period Ton in this manner, power consumption can be sufficiently reduced.

In the alarm device to which power is supplied only with a battery, battery drain is reduced by achieving sufficient reduction in power consumption, so that an alternate battery or maintenance such as battery replacement can be reduced. In particular, since the fire alarm is generally placed on a high place such as a ceiling, a specialist is required for maintenance in some cases; however, by suppressing power drain, maintenance fee such as employment cost can also be reduced.

In addition, by provision of the volatile memory portion 106 and the nonvolatile memory portion 107 in the CPU 105, data can be stored from the volatile memory portion 106 in the nonvolatile memory portion 107 before supply of power to the CPU 105 is stopped and data can be quickly restored from the nonvolatile memory portion 107 to the volatile memory portion 106 when the supply of power to the CPU 105 is resumed. Thus, after the supply of power is resumed, the CPU 105 can start arithmetic processing immediately.

By provision of the volatile memory portion 106 and the nonvolatile memory portion 107 which can store and restore data in this manner, even when power consumption of the CPU 105 is reduced by providing the power supply period Ton and the power-off period Toff, the alarm device operate without a large increase in time required for start up of the CPU 105.

The methods, structures, and the like described in this embodiment can be combined as appropriate with any of the methods, structures, and the like described in the other embodiments.

Embodiment 2

In this embodiment, an example of a configuration of the photosensor portion described in the above embodiment, particularly the photo sensor 111, is described with reference to FIG. 7.

Figure 7:
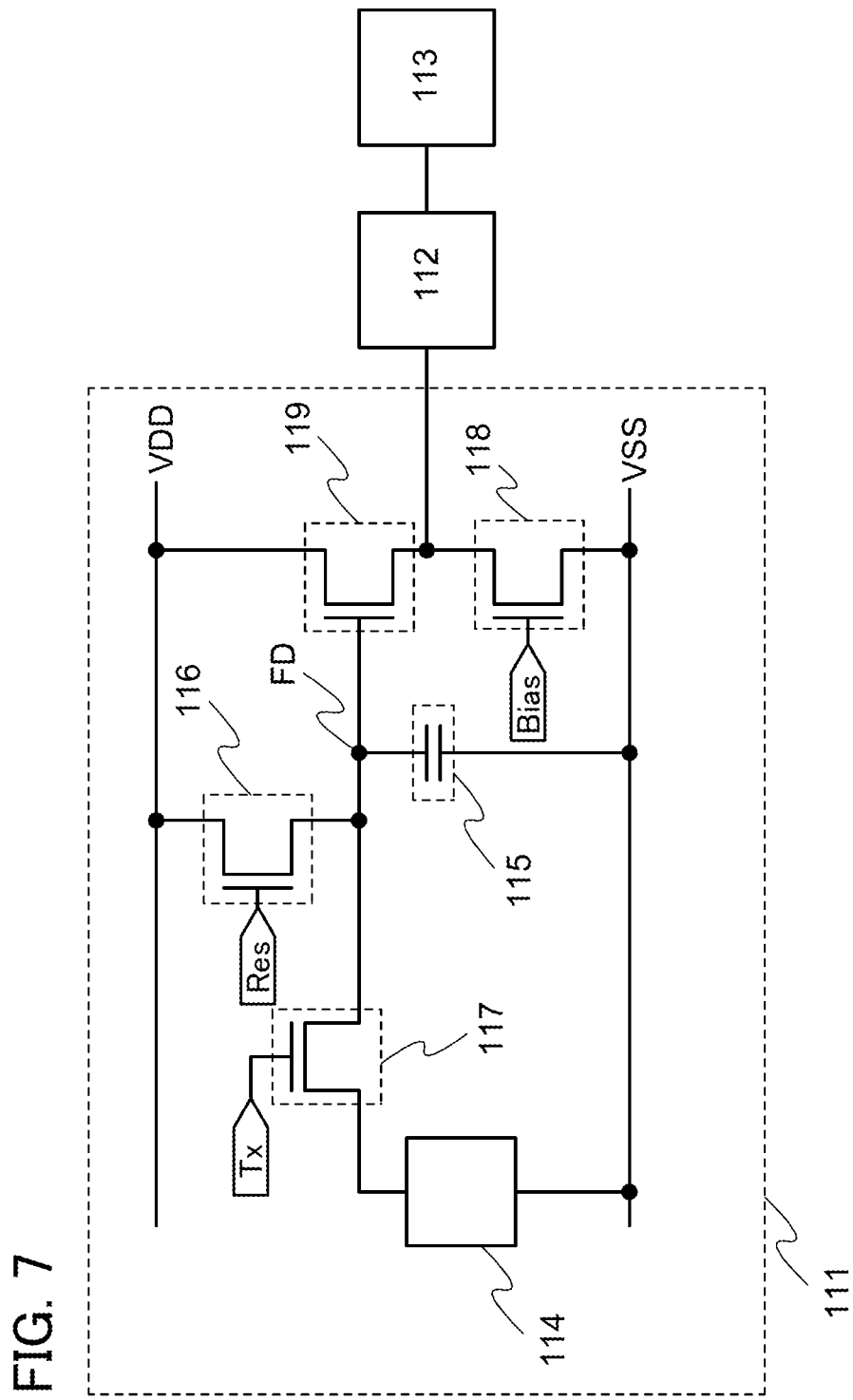
FIG. 7 is an equivalent circuit diagram of part of an alarm device according to one embodiment of the disclosed invention.

FIG. 7 shows an example of a circuit configuration of a photosensor portion of an alarm device, according to one embodiment of the disclosed invention. Note that in FIG. 7, the same reference numerals are used for the same components as those in FIG. 1.

The photosensor portion in FIG. 7 includes the photo sensor 111, the amplifier 112, and the AD converter 113. The photo sensor 111 includes a photoelectric conversion element 114, a capacitor 115, a transistor 116, a transistor 117, a transistor 118, and a transistor 119. As the photoelectric conversion element 114, a photodiode or the like can be used here, for example.

One of terminals of the photoelectric conversion element 114 is electrically connected to the low potential power supply line VSS, and the other of the terminals thereof is electrically connected to one of a source electrode and a drain electrode of the transistor 117. A gate electrode of the transistor 117 is supplied with an electric charge accumulation control Tx, and the other of the source electrode and the drain electrode thereof is electrically connected to one of a pair of electrodes of the capacitor 115, one of a source electrode and a drain electrode of the transistor 116, and a gate electrode of the transistor 119 (hereinafter the node is referred to as a node FD in some cases). The other of the pair of electrodes of the capacitor 115 is electrically connected to the low potential power supply line VSS. A gate electrode of the transistor 116 is supplied with a reset signal Res, and the other of the source electrode and the drain electrode thereof is electrically connected to the high potential power supply line VDD. One of a source electrode and a drain electrode of the transistor 119 is electrically connected to one of a source electrode and a drain electrode of the transistor 118 and the amplifier 112. The other of the source electrode and the drain electrode of the transistor 119 is electrically connected to the high potential power supply line VDD. A gate electrode of the transistor 118 is supplied with a bias signal Bias, and the other of the source electrode and the drain electrode thereof is electrically connected to the low potential power supply line VSS.

The photo sensor 111 operates in the following manner. First, a potential at which the transistor 116 is turned on is supplied as the reset signal Res, so that the transistor 116 is turned on. Accordingly, the high potential H of the high potential power supply line VDD is supplied to the node FD, so that the photo sensor 111 is reset.

Next, the transistor 116 is turned off and the transistor 117 is supplied with a potential at which the transistor 117 is turned on as the electric charge accumulation control signal Tx. Thus, when the light 13 from the light-emitting element 130 described in the above embodiment enters the photoelectric conversion element 114, photocurrent flows to the photoelectric conversion element 114 in accordance with the amount of received light 13, and the capacitor 115 performs discharging in accordance with the photocurrent. Consequently, a potential of the node FD is decreased in accordance with the photocurrent. Note that in the case where light from the light-emitting element 130 does not enter the photoelectric conversion element 114, the amount of flowing photocurrent is smaller than that in the case where light 13 from the light-emitting element 130 enters the photoelectric conversion element 114; therefore, a decrease in the potential of the node FD is also small.

When the transistor 117 is turned off after a certain period, the discharge of the capacitor 115 is stopped and the potential of the node FD is determined. The potential of the node FD is output to the amplifier 112 from the transistor 118 and the transistor 119 included in a source follower circuit. A potential amplified by the amplifier 112 is input to the AD converter 113, and a potential converted from an analog signal to a digital signal in the AD converter 113 is transmitted, as a measurement value obtained by the photosensor portion, to the CPU 105 described in the above embodiment.

The above-described photosensor portion can be used for the alarm device described in Embodiment 1 in which low power consumption is achieved.

Since the photosensor portion described in this embodiment can be incorporated into the microcomputer 100 described in the above embodiment, the number of components can be reduced and the size of the housing 10 can be reduced.

Note that the capacitor 115 is not necessarily provided. For example, in the case where parasitic capacitance of the transistor 119 or the like is sufficiently large, a structure without the capacitor 115 may be employed. Further, as each of the transistors 116 and 117, the transistor with extremely low off-state current which is described in the above embodiment is preferably used. As the transistor with extremely low off-state current, a transistor including an oxide semiconductor is preferably is used as described in the above embodiment. With such a structure, the potential of the node FD can be held for a long time.

The configuration of the photosensor portion described in this embodiment is merely an example and can be modified as appropriate depending on conditions of the alarm device or the like.

The methods, structures, and the like described in this embodiment can be combined as appropriate with any of the methods, structures, and the like described in the other embodiments.

Embodiment 3

In this embodiment, an example of a configuration of the temperature sensor portion described in the above embodiment, particularly the temperature sensor 121, is described with reference to FIG. 8.

Figure 8:
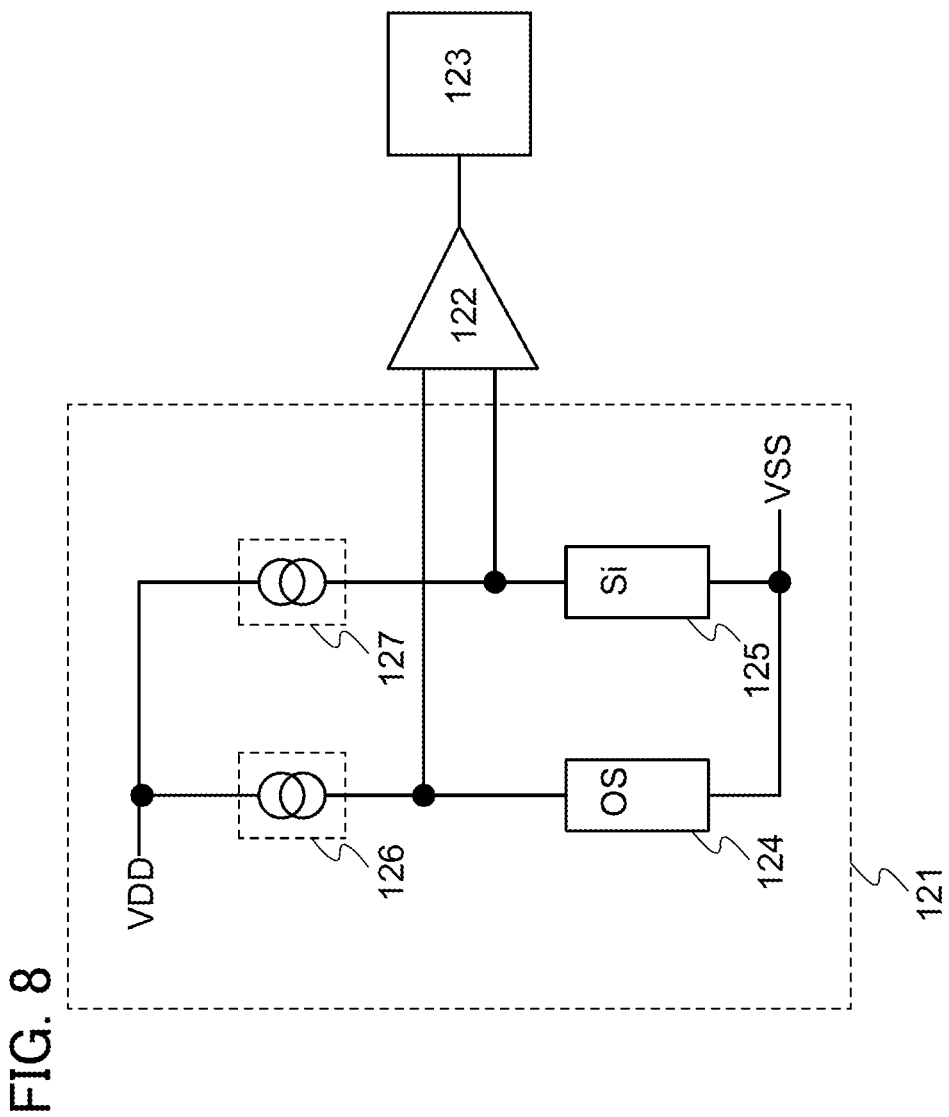
FIG. 8 is an equivalent circuit diagram of part of an alarm device according to one embodiment of the disclosed invention.

FIG. 8 shows an example of a circuit configuration of a temperature sensor portion of an alarm device, according to one embodiment of the disclosed invention. Note that in FIG. 8, the same reference numerals are used for the same components as those in FIG. 1.

The temperature sensor portion in FIG. 8 includes the temperature sensor 121, the amplifier 122, and the AD converter 123. The temperature sensor 121 includes a semiconductor element 124 including an oxide semiconductor, a semiconductor element 125 including a semiconductor whose temperature dependency is higher than that of an oxide semiconductor, a constant current circuit 126, and a constant current circuit 127.

One of terminals of the semiconductor element 124 is electrically connected to the low potential power supply line VSS, and the other of the terminals thereof is electrically connected to one of terminals of the constant current circuit 126 and one of terminals of the amplifier 122. The other of the terminals of the constant current circuit 126 is electrically connected to the high potential power supply line VDD. One of terminals of the semiconductor element 125 is electrically connected to the low potential power supply line VSS, and the other of the terminals thereof is electrically connected to one of terminals of the constant current circuit 127 and the other of the terminals of the amplifier 122. The other of the terminals of the constant current circuit 127 is electrically connected to the high potential power supply line VDD.

As an oxide semiconductor used for the semiconductor element 124, for example, it is possible to use the oxide semiconductor which is used for the transistor with extremely low off-state current in the above embodiment. The semiconductor element 124 can be formed by short-circuiting a gate electrode and a drain electrode of a transistor. Further, the semiconductor element 125 includes a semiconductor whose temperature dependency is higher than that of an oxide semiconductor, such as single crystal silicon, polycrystalline silicon, microcrystalline silicon, or amorphous silicon; however, one embodiment of the present invention is not limited thereto. The semiconductor element 125 may be formed, for example, by short-circuiting a gate electrode and a drain electrode of a transistor or using a simple PN junction.

When constant current flows from the constant current circuit 126 and the constant current circuit 127, voltage is generated between both ends of each of the semiconductor elements 124 and 125. Here, in the semiconductor element 124 including an oxide semiconductor, a change in electrical characteristics due to temperature is small, whereas in the oxide element 125, a change in electrical characteristics due to temperature is large. Accordingly, voltage generated between the both ends of the semiconductor element 124 is hardly affected by temperature, and voltage generated between the both ends of the semiconductor element 125 is significantly affected by temperature.

When the voltage generated between the both ends of the semiconductor element 124 and the voltage generated between the both ends of the semiconductor element 125 are input to the amplifier 122 functioning as a differential amplifier circuit and amplified, a potential in accordance with the temperature can be obtained. The potential amplified by the amplifier 122 is input to the AD converter 123, and a potential converted from an analog signal to a digital signal in the AD converter 123 is transmitted, as a measurement value obtained by the temperature sensor portion, to the CPU 105 described in the above embodiment.

Note that in the CPU 105, a look-up table may be provided in which a collection of data of an output potential of the AD converter 123 related to temperature information of an object to be sensed is saved. Further, data in accordance with temperature can be obtained by performing arithmetic processing with reference to the data stored in the look-up table.

The above-described temperature sensor portion can be used for the alarm device described in the above embodiment in which low power consumption is achieved.

Since the temperature sensor portion described in this embodiment can be incorporated into the microcomputer 100 described in Embodiment 1, the number of components can be reduced and the size of the housing 10 can be reduced.

The configuration of the temperature sensor portion described in this embodiment is merely an example and can be modified as appropriate depending on conditions of the alarm device or the like.

The methods, structures, and the like described in this embodiment can be combined as appropriate with any of the methods, structures, and the like described in the other embodiments.

Embodiment 4

In this embodiment, an example of a method for manufacturing the microcomputer 100 which is provided in the alarm device described in the above embodiment is described with reference to FIGS. 9A to 9D, FIGS. 10A to 10C, FIGS. 11A to 11C, FIGS. 12A and 12B, and FIG. 13. A method for manufacturing the transistor 140 and the transistor 142 in the nonvolatile memory portion 107 in FIG. 4B is described. Note that in FIGS. 9A to 9D, FIGS. 10A to 10C, FIGS. 11A to 11C, and FIGS. 12A and 12B, a cross-sectional view taken along line A-B corresponds to a cross-sectional view of a region where the transistor 140 including an oxide semiconductor as a wide band gap semiconductor and the n-channel transistor 142 are formed, and a cross-sectional view taken along line C-D corresponds to a cross-sectional view of the node M1 at which the drain electrode (or the source electrode) of the transistor 140 including an oxide semiconductor film is connected to the gate electrode of the n-channel transistor 142.

Note that the transistor included in the volatile memory portion or the like and formed using silicon or the like, which is described in the above embodiment, can be formed using a material and a method that are similar to those of the transistor 142. Further, the transistor included in the nonvolatile memory portion or the like and formed using an oxide semiconductor or the like, which is described in the above embodiment, can be formed using a material and a method that are similar to those of the transistor 140.

First, as illustrated in FIG. 9A, element isolation regions 203 are formed in a p-type semiconductor substrate 201.

As the p-type semiconductor substrate 201, a single crystal silicon substrate (a silicon wafer) having p-type conductivity, or a compound semiconductor substrate (e.g., a SiC substrate or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from a surface and defects generated in a surface layer are eliminated by high-temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation region 203 can be formed by a local oxidation of silicon (LOCOS) method, a shallow trench isolation (STI) method, or the like.

In the case where a p-channel transistor is formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Next, as illustrated in FIG. 9B, a gate insulating film 207 and a gate electrode 209 are formed over the semiconductor substrate 201.

A surface of the semiconductor substrate 201 is oxidized by heat treatment, so that a silicon oxide film is formed. Alternatively, a silicon oxide film is formed by thermal oxidation, and then a surface of the silicon oxide film is nitrided by nitridation treatment; thus a layered structure including the silicon oxide film and a silicon film containing oxygen and nitrogen (silicon oxynitride film) is formed. Next, part of the silicon oxide film or the silicon oxynitride film is selectively etched to form the gate insulating film 207. Alternatively, the gate insulating film 207 is formed in such a manner that silicon oxide, silicon oxynitride, a metal oxide such as a tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to a thickness of 5 nm to 50 nm by a CVD method, a sputtering method, or the like, and then part thereof is selectively etched.

The gate electrode 209 is preferably formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Alternatively, the gate electrode 209 may be formed to have a layered structure of a metal nitride film and a film of any of the metals. As a metal nitride, tungsten nitride, molybdenum nitride, or titanium nitride can be used. When the metal nitride film is provided, adhesiveness of the metal film can be increased; thus, separation can be prevented.

The gate electrode 209 is formed in such a manner that a conductive film is formed by a sputtering method, a CVD method, or the like and then part of the conductive film is selectively etched.

Here, the surface of the semiconductor substrate 201 is oxidized by heat treatment to form a silicon oxide film; a conductive film including a stack of a tantalum nitride film and a tungsten film is formed over the silicon oxide film by a sputtering method; and then part of the silicon oxide film and part of the conductive film are selectively etched. Thus, the gate insulating film 207 and the gate electrode 209 are formed.

Note that for high integration, a structure in which a sidewall insulating layer is not provided on a side surface of the gate electrode 209 is preferable. On the other hand, when the characteristics of the transistor have priority, a sidewall insulating layer can be provided on the side surface of the gate electrode 209.

Next, as illustrated in FIG. 9C, an impurity element imparting n-type conductivity is added to the semiconductor substrate 201 to form n-type impurity regions 211a and 211b. In the case where an n-well region is formed in the same substrate, p-type impurity regions are formed by addition of an impurity element imparting p-type conductivity to the n-well region. The concentration of the impurity element imparting n-type conductivity in the n-type impurity regions 211a and 211b and the concentration of the impurity element imparting p-type conductivity in the p-type impurity regions preferably range from $1 \times 10^{19}$/cm$^3$ to $1 \times 10^{21}$/cm$^3$. The impurity element imparting n-type conductivity and the impurity element imparting p-type conductivity are added to the semiconductor substrate 201 and the n-well region, respectively, by an ion doping method, an ion implantation method, or the like as appropriate.

In the case where a sidewall insulating layer is provided on the side surface of the gate electrode 209, an impurity region having impurity concentration different from that in the n-type impurity regions 211a and 211b and that in the p-type impurity regions can be formed in a region overlapping with the sidewall insulating layer.

Next, as illustrated in FIG. 9D, an insulating film 215 and an insulating film 217 are formed over the semiconductor substrate 201, the element isolation regions 203, the gate insulating film 207, and the gate electrode 209 by a sputtering method, a CVD method, or the like.

The insulating films 215 and 217 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, the hydrogen content of the insulating film 215 is increased. By performing heat treatment using the insulating film 215, it is possible to hydrogenate the semiconductor substrate, to terminate a dangling bond by hydrogen, and to reduce defects in the semiconductor substrate.

Note that the flatness of the insulating film 217 can be increased when the insulating film 217 is formed using an inorganic material such as borophosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions.

Through the above steps, the n-channel transistor 142 can be formed as illustrated in FIG. 9D. Here, the transistor 142 is formed using a semiconductor other than an oxide semiconductor, such as single crystal silicon, so that the transistor 142 can operate at high speed. Accordingly, a volatile memory portion of a CPU that can achieve high-speed access can be formed.

Next, some of the insulating films 215 and 217 are selectively etched to form openings. Then, contact plugs 219a and 219b are formed in the openings. Typically, the contact plugs 219a and 219b are formed in such a manner that after a conductive film is formed by a sputtering method, a CVD method, or the like, planarization treatment is performed by a chemical mechanical polishing (CMP) method, etching, or the like so that an unnecessary portion of the conductive film is removed.

The conductive film serving as the contact plugs 219a and 219b is formed in such a manner that tungsten silicide is formed using a WF$_6$ gas and a SiH$_4$ gas by a CVD method to fill the openings.

Next, an insulating film is formed over the insulating film 217 and the contact plugs 219a and 219b by a sputtering method, a CVD method, or the like, and then, part of the insulating film is selectively etched to form an insulating film 221 having a groove portion. Then, after a conductive film is formed by a sputtering method, a CVD method, or the like, planarization treatment is performed by a CMP method, etching, or the like, and an unnecessary portion of the conductive film is removed; thus, wirings 223a and 223b are formed (see FIG. 10A).

The insulating film 221 can be formed using a material that is similar to the material of the insulating film 215.

The wirings 223a and 223b are formed to have a single-layer structure or a layered structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in that order can be given. Note that a transparent conductive material containing indium oxide, tin oxide, or zinc oxide may be used.

Next, an insulating film 220 is formed over the insulating film 221, the wiring 223a, and the wiring 223b by a sputtering method, a CVD method, or the like. An insulating film is formed over the insulating film 220 by a sputtering method, a CVD method, or the like, and then part of the insulating film is selectively etched to form an insulating film 222 having a groove portion. Then, after a conductive film is formed by a sputtering method, a CVD method, or the like, planarization treatment is performed by a CMP method, etching, or the like, and an unnecessary portion of the conductive film is removed; thus, an electrode 224 is formed (see FIG. 10B).

Here, each of the insulating film 220 and the insulating film 222 can be formed using a material that is similar to the material of the insulating film 215. Note that a selectivity ratio of the insulating film 220 with respect to the insulating film 222 is preferably high.

Here, the electrode 224 functions as a back gate electrode of the transistor 140 to be described later. The electrode 224 can control the threshold voltage of the transistor 140. The electrode 224 may be electrically isolated (floating) or may be supplied with a potential from another element. The state of the electrode 224 can be set as appropriate based on control of the threshold voltage of the transistor 140. Note that the material of the electrode 224 can be similar to the material of a gate electrode 233 to be described later.

Note that in this embodiment, the electrode 224 is provided over the wiring 223a and the wiring 223b; however, the present invention is not limited thereto. For example, the electrode 224 may be formed in the same conductive layer as the wiring 223a and the wiring 223b.

Using the insulating film 222 and the electrode 224 which are planarized, variations in electrical characteristics of a transistor including an oxide semiconductor film to be formed later can be reduced. Further, the transistor including an oxide semiconductor film can be formed with a high yield.

Next, heat treatment or plasma treatment is preferably performed so that hydrogen contained in the insulating film 221, the wirings 223a and 223b, the insulating films 220 and 222, and the electrode 224 is released. Consequently, in heat treatment performed later, diffusion of hydrogen into an insulating film and an oxide semiconductor film to be formed later can be prevented. The heat treatment is performed at higher than or equal to 100° C. and lower than the strain point of the substrate in an inert atmosphere, a reduced-pressure atmosphere, or a dry air atmosphere. Further, in the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating film 222 and the electrode 224 by a sputtering method, a CVD method, or the like. The insulating film 225 can be formed to have a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. The oxide insulating film from which part of oxygen is released by heating is an oxide insulating film that contains oxygen at a proportion exceeding the stoichiometric proportion. Oxygen is released by heating from the oxide insulating film from which part of oxygen is released by heating; thus, oxygen can be diffused into the oxide semiconductor film by heating performed in a later step.

In the case where the insulating film 225 has a layered structure, the insulating film 225 is preferably an insulating film serving as a barrier film that prevents entry of an impurity that diffuses from a lower layer. In particular, in the case where a single crystal silicon substrate, an SOI substrate, a substrate over which a semiconductor element formed using silicon or the like is provided, or the like is used as the semiconductor substrate 201, hydrogen or the like contained in the substrate can be prevented from being diffused and entering the oxide semiconductor film to be formed later. As such an insulating film, for example, a silicon nitride film, a silicon nitride oxide film, or an aluminum oxide film formed by a plasma-enhanced CVD method, a sputtering method, or the like can be used.

The insulating film 225 is preferably planarized by CMP treatment or the like. A surface of the insulating film 225 has an average surface roughness (Ra) of 1 nm or less, preferably 0.3 nm or less, more preferably 0.1 nm or less.

Note that in this specification and the like, the average surface roughness (Ra) is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface.

When the specific surface is expressed as Z=F(X,Y), the average surface roughness (Ra) is an average value of the absolute values of deviations from the reference surface to the specific surface and is shown by the following formula.

$$Ra = \frac{1}{S_0} \int_{y_1}^{y_2} \int_{x_1}^{x_2} |f(x, y) - Z_0| dx dy$$

The specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Here, $S_0$ represents the area of a rectangle which is obtained by projecting the specific surface on the xy plane, and $Z_0$ represents the height of the reference surface (the average height of the specific surface). The average surface roughness (Ra) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. In other words, the plasma treatment is treatment in which the surface to be processed is irradiated with ions of an inert gas and minute unevenness of the surface is reduced by a sputtering effect. Thus, the plasma treatment can also be referred to as "reverse sputtering treatment".

When the plasma treatment is performed, electrons and argon cations are present in plasma and the argon cations are accelerated in a cathode direction. The surface to be processed is sputtered by the accelerated argon cations. At this time, a projected portion of the surface to be processed is preferentially sputtered. Particles generated by sputtering from the surface to be processed attach to another place of the surface to be processed. At this time, the particles generated by sputtering from the surface to be processed preferentially attach to a depression of the surface to be processed. By thus reducing the projected portion and filling the depression, the planarity of the surface to be processed is increased. Note that a combination of plasma treatment and CMP treatment can further planarize the insulating film 225.

Note that through the plasma treatment, it is possible to remove impurities such as oxygen, moisture, and an organic compound that attach to the surface of the insulating film 225 by a sputtering effect.

It is preferable that impurities such as hydrogen, water, a hydroxyl group, and hydride in a treatment chamber be removed by heating and evacuation of the treatment chamber before formation of an oxide semiconductor. It is particularly important to remove such impurities adsorbed on an inner wall of the treatment chamber. Here, heat treatment may be performed at 100° C. to 450° C. Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has high capability in evacuating a large molecule, whereas it has low capability in evacuating hydrogen or water. Further, a combination with a cryopump having high capability in evacuating water or a sputter ion pump having high capability in evacuating hydrogen is effective. At this time, when the impurities are removed while an inert gas is introduced, the rate of elimination of water or the like, which is difficult to eliminate only by evacuation, can be further increased. Removal of impurities in the treatment chamber by such treatment before the formation of the oxide semiconductor can prevent hydrogen, water, a hydroxyl group, hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture that attach to the target surface or a deposition shield may be removed.

Figure 10A:
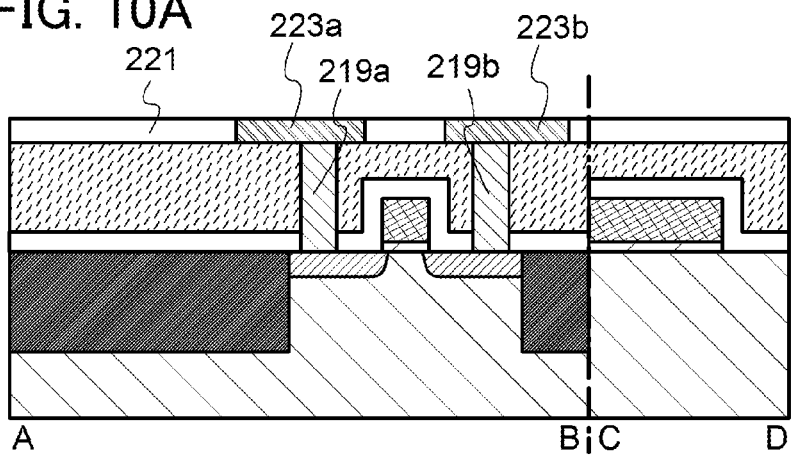
FIGS. 10A to 10C are cross-sectional views illustrating some of steps of manufacturing an alarm device according to one embodiment of the disclosed invention.
Figure 10B:
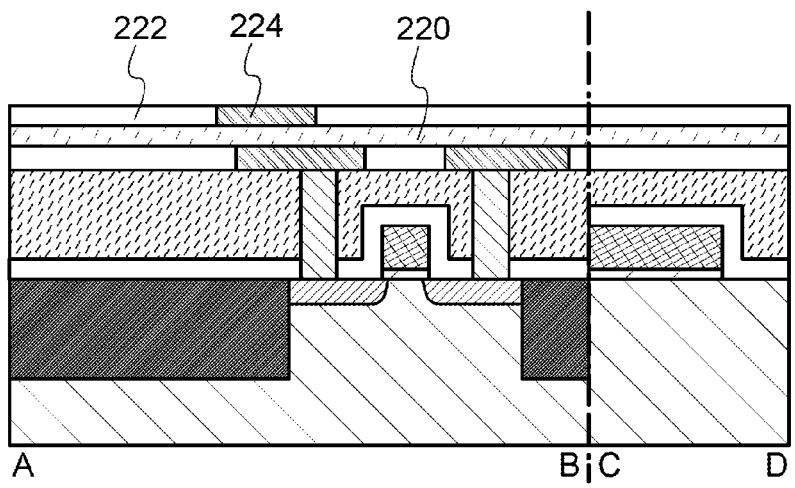
Figure 10C:
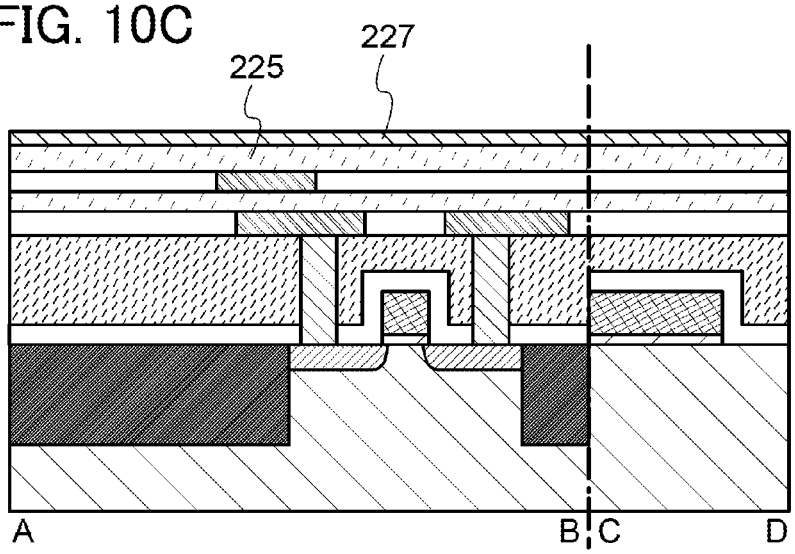

Next, an oxide semiconductor film 227 is formed over the insulating film 225 by a sputtering method, a coating method, a printing method, an evaporation method, a PCVD method, a PLD method, an ALD method, an MBE method, or the like (see FIG. 10C). Here, as the oxide semiconductor film 227, an oxide semiconductor film having a thickness of 1 nm to 50 nm, preferably 3 nm to 20 nm is formed by a sputtering method. When the oxide semiconductor film 227 has a thickness in the above range, a short-channel effect which might be caused due to downsizing of the transistor can be suppressed.

An oxide semiconductor used for the oxide semiconductor film 227 preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, a Sn—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Sn—Zn-based oxide, a Sn—Ga—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, or an In—Sn—Hf—Zn-based oxide. Moreover, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than the In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, where n is an integer) may be used.

Note that the concentration of alkali metals or alkaline earth metals in the oxide semiconductor film 227 is preferably $1\times10^{18}$ atoms/cm$^3$ or lower, more preferably $2\times10^{16}$ atoms/cm$^3$ or lower. When an alkali metal or an alkaline earth metal is bonded to an oxide semiconductor, carriers are generated in some cases, which causes an increase in off-state current of the transistor.

The oxide semiconductor film 227 may contain nitrogen at $5\times10^{18}$ atoms/cm$^3$ or lower.

As an oxide semiconductor which can be used for the oxide semiconductor film 227, a wide band gap semiconductor which has a wider band gap and lower intrinsic carrier density than a silicon semiconductor is used. The band gap of the wide band gap oxide semiconductor is 2.5 eV to 4 eV, preferably 3 eV to 3.8 eV. The off-state current of a transistor can be reduced by using an oxide semiconductor having a wide energy gap.

The oxide semiconductor film 227 may have a single crystal structure or may be in a non-single-crystal state. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

In an oxide semiconductor in an amorphous state, a flat surface can be obtained with relative ease, so that when a transistor is formed with the use of the oxide semiconductor, interface scattering can be reduced, and comparatively high mobility can be obtained with relative ease.

In a crystalline oxide semiconductor, defects in a bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness (Ra) of the surface of the insulating film 225 is 1 nm or less, preferably 0.3 nm or less, more preferably 0.1 nm or less, and the oxide semiconductor film 227 is preferably formed over the insulating film 225.

Here, the oxide semiconductor film 227 is formed by a sputtering method. As a target, a target corresponding to the oxide can be used.

In the case where an In—Ga—Zn—O-based material is used as the oxide semiconductor, the target can be formed as appropriate in accordance with the material and composition of the oxide semiconductor film 227. For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above compositions is preferably used as the target. However, the material and composition of the target are not limited to the above.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, density, and the like be set to appropriate values. Alternatively, oxide semiconductor films which have different constitutions (typified by composition) may be stacked or may be separately provided as a channel formation region and source and drain regions as appropriate.

For example, the oxide semiconductor film 227 may be a stack of a first oxide semiconductor film, a second oxide semiconductor film, and a third oxide semiconductor film, which each have a different composition. For example, the first oxide semiconductor film and the third oxide semiconductor film may be formed using a three-component metal oxide, and the second oxide semiconductor film may be formed using a two-component metal oxide. It is preferable that the first to third oxide semiconductor films are formed using materials which contain the same components. In the case where the materials containing the same components are used, the second oxide semiconductor film can be formed over the first oxide semiconductor film using a crystal layer of the first oxide semiconductor film as a seed; therefore, crystal growth of the second oxide semiconductor film can be easily caused. The same applies to the third oxide semiconductor film. In addition, in the case where the materials containing the same components are used, an interface property such as adhesion or electrical characteristics is good.

Further, the constituent elements of the first oxide semiconductor film, the second oxide semiconductor film, and the third oxide semiconductor film may be the same and the compositions of the constituent elements of the first oxide semiconductor film, the second oxide semiconductor film, and the third oxide semiconductor film may be different. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may have an atomic ratio of In:Ga:Zn=1:3:2, and the second oxide semiconductor film may have an atomic ratio of In:Ga:Zn=3:1:2.

As a sputtering gas, a rare gas (typically argon) atmosphere, an oxygen atmosphere, or a mixed gas of a rare gas and oxygen is used as appropriate. In the case of the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use an atmosphere of a high-purity gas from which impurities such as hydrogen, water, a hydroxyl group, and hydride are sufficiently removed.

In a sputtering method, an RF power source, an AC power source, a DC power source, or the like can be used as a power source for generating plasma as appropriate.

Note that the leakage rate of a treatment chamber in which the oxide semiconductor film is formed is preferably $1 \times 10^{-10}$ Pa·m$^3$/s or lower so that entry of an impurity into a film to be formed by a sputtering method can be reduced. As described above, in the process for forming the oxide semiconductor film and preferably in the process for forming the oxide insulating film, entry of impurities is suppressed as much as possible through control of the pressure of the treatment chamber, the leakage rate of the treatment chamber, and the like. Thus, entry of impurities including hydrogen into the oxide semiconductor film can be reduced. In addition, diffusion of impurities such as hydrogen from the oxide insulating film into the oxide semiconductor film can be reduced.

The oxide semiconductor film 227 may include a c-axis aligned crystalline oxide semiconductor (CAAC-OS) including crystal parts, for example. In the CAAC-OS, for example, c-axes are aligned, and a-axes and/or b-axes are not macroscopically aligned.

For example, the oxide semiconductor film 227 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 227 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 227 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a layered structure including a region of an amorphous oxide semiconductor, a region of a microcrystalline oxide semiconductor, and a region of a CAAC-OS, for example.

Note that the oxide semiconductor film 227 may be in a single-crystal state, for example.

The oxide semiconductor film 227 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes might be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, change in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal part such as a CAAC-OS, defects in the bulk can be further reduced and when the surface flatness of the oxide semiconductor is increased, mobility higher than that of an oxide semiconductor in an amorphous state can be obtained. In order to increase the surface flatness, the oxide semiconductor is preferably formed over a flat surface. Specifically, the oxide semiconductor may be formed over a surface with an average surface roughness (Ra) of 1 nm or less, preferably 0.3 nm or less, more preferably 0.1 nm or less.

In the case where a CAAC-OS film is used as the oxide semiconductor film 227, for example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby a crystal state of the sputtering target is transferred to the substrate. As a result, the CAAC-OS film can be formed.

For the deposition of the CAAC-OS film, the following conditions are preferably used.

By reducing the concentration of impurities during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing a substrate heating temperature during the deposition, migration of a sputtered particle is likely to occur after the sputtered particle is attached to a substrate surface. Specifically, the substrate heating temperature during the deposition is set to higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is greater than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

After the oxide semiconductor film 227 is formed, the oxide semiconductor film 227 may be subjected to heat treatment. The heat treatment can further remove a substance including a hydrogen atom in the oxide semiconductor film 227; thus, the structure of the oxide semiconductor film 227 can be improved and defect states in the energy gap can be reduced. The heat treatment is performed in an inert gas atmosphere at higher than or equal to 300° C. and lower than or equal to 700° C., preferably higher than or equal to 450° C. and lower than or equal to 600° C., or lower than the strain point of the substrate in the case where the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a manner that, for example, the semiconductor substrate 201 is introduced into an electric furnace using a resistance heating element or the like and heated at 450° C. for an hour in a nitrogen atmosphere.

The heat treatment apparatus is not limited to the electric furnace and may be an apparatus for heating an object by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen, or a rare gas such as argon is used. Note that in the case where a GRTA apparatus is used as the heat treatment apparatus, the substrate may be heated in an inert gas heated to a high temperature of 650° C. to 700° C. because the heat treatment time is short.

In addition, it is preferable that after the oxide semiconductor film 227 is heated by the heat treatment, a high-purity oxygen gas, a high-purity $N_2O$ gas, or ultra dry air (the moisture concentration is 20 ppm (−55° C. by conversion into a dew point) or lower, preferably 1 ppm or lower, more preferably 10 ppb or lower, in the case where measurement is performed by a dew point meter of a cavity-ring down laser spectroscopy (CRDS) method) be introduced into the same furnace. It is particularly preferable that water, hydrogen, and the like be not contained in these gases. The purity of the oxygen gas or the $N_2O$ gas that is introduced into the same furnace is preferably 6N or higher, more preferably 7N or higher (i.e., the impurity concentration in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been reduced through the step of removing impurities by dehydration or dehydrogenation can be supplied.

The heat treatment has an effect of removing hydrogen, water, and the like and can be referred to as dehydration, dehydrogenation, or the like. The heat treatment can be performed at timing, for example, before the oxide semiconductor layer is processed to have an island shape or after the gate insulating film is formed. Such heat treatment for dehydration or dehydrogenation may be performed once or plural times.

Figure 11A:
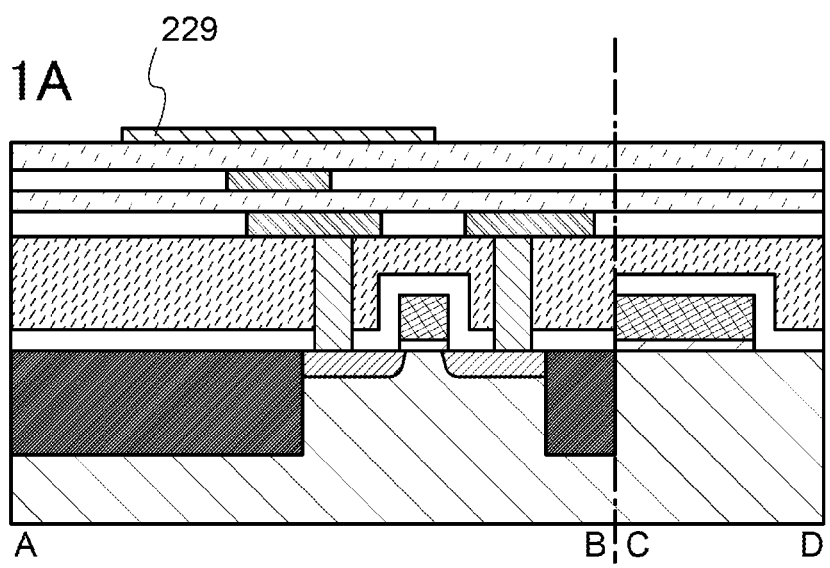
FIGS. 11A to 11C are cross-sectional views illustrating some of steps of manufacturing an alarm device according to one embodiment of the disclosed invention.

Next, part of the oxide semiconductor film 227 is selectively etched, so that an oxide semiconductor film 229 is formed to overlap with the electrode 224 (see FIG. 11A).

Figure 11B:
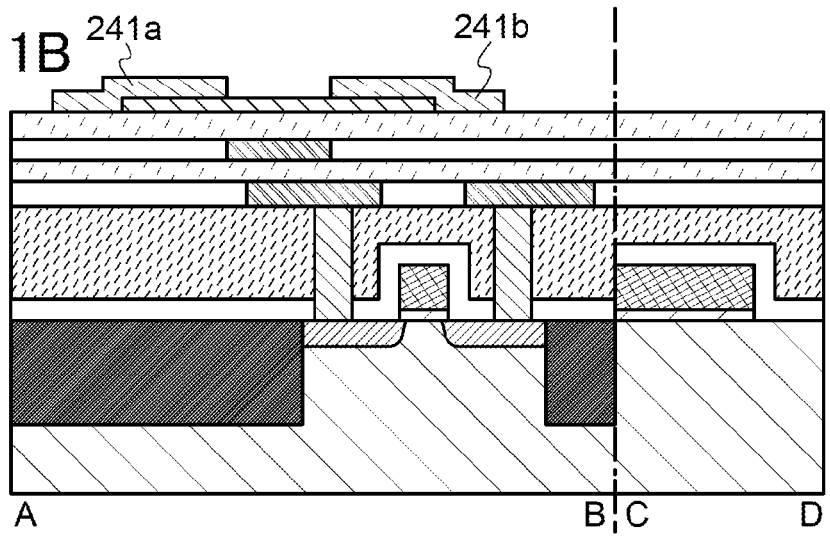
Figure 11C:
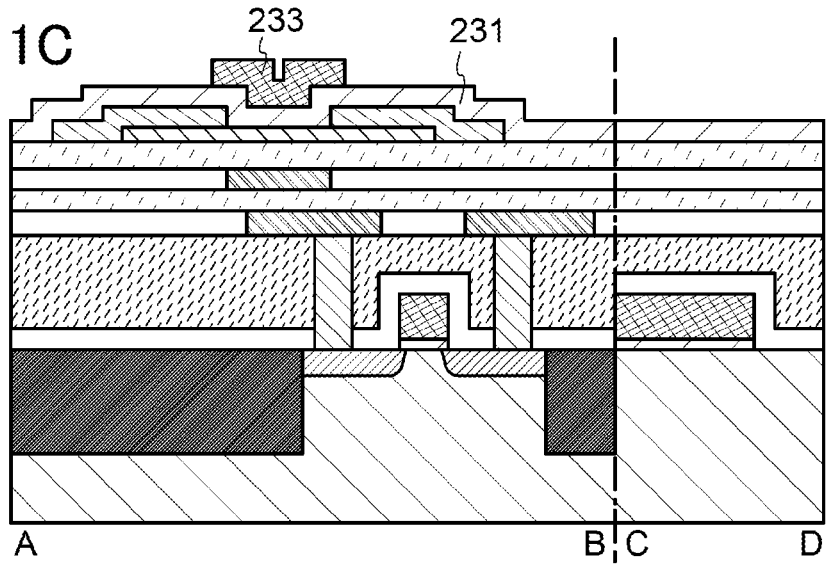

Next, a conductive film is formed on and in contact with the oxide semiconductor film 229 and part of the conductive film is selectively etched, whereby a pair of electrodes 241a and 241b is formed on and in contact with the oxide semiconductor film 229 (see FIG. 11B).

The pair of electrodes 241a and 241b can be formed using a material similar to that of the wirings 223a and 223b as appropriate. Note that the pair of electrodes 241a and 241b may function as wirings.

The pair of electrodes 241a and 241b is formed in such a manner that a conductive film is formed by a sputtering method, a CVD method, an evaporation method, or the like and then part of the conductive film is selectively etched. Alternatively, the pair of electrodes 241a and 241b is formed by a printing method or an inkjet method.

Next, a gate insulating film 231 is formed over the oxide semiconductor film 229 and the electrodes 241a and 241b by a sputtering method, a CVD method, or the like. Then, a gate electrode 233 is formed over the gate insulating film 231 so as to overlap with the oxide semiconductor film 229 (see FIG. 11C).

A high-density plasma-enhanced CVD using microwaves (e.g., with a frequency of 2.45 GHz) is preferably employed for forming the gate insulating film 231 serving as a gate insulating film because an insulating layer can be dense and can have high breakdown voltage and high quality. This is because when a highly purified oxide semiconductor is closely in contact with a high-quality gate insulating film, the interface state can be reduced and interface properties can be favorable.

The gate insulating film 231 may be formed to have a single layer or a stack including one or more of silicon oxide, silicon oxynitride, silicon nitride oxide, silicon nitride, aluminum oxide, hafnium oxide, gallium oxide, a Ga—Zn—O-based metal oxide, and the like. The gate insulating film 231 may be an oxide insulating film from which oxygen is released by heating, such as a film that can be used as the insulating film 225. By using a film from which oxygen is released by heating as the gate insulating film 231, oxygen vacancies caused in the oxide semiconductor film 229 can be reduced by heat treatment performed later and deterioration of electrical characteristics of the transistor can be suppressed.

When the gate insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced even when the thickness of the gate insulating film is small.

The thickness of the gate insulating film 231 is preferably 1 nm to 300 nm, more preferably 5 nm to 50 nm, still more preferably 10 nm to 30 nm.

The gate electrode 233 can be formed using a metal element selected from aluminum, chromium, copper, tantalum, titanium, molybdenum, and tungsten; an alloy containing any of these metal elements as its component; an alloy containing these metal elements in combination; or the like. Further, one or more metal elements selected from manganese and zirconium may be used. The gate electrode 233 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure including the light-transmitting conductive material and the metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

Further, as a material layer that is in contact with the gate insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or ZnN) is preferably provided between the gate electrode 233 and the gate insulating film 231. These films each have a work function of 5 eV or higher, preferably 5.5 eV or higher; thus, the threshold voltage of the transistor can be positive. Accordingly, a so-called normally-off switching element can be obtained. For example, in the case where an In—Ga—Zn—O film containing nitrogen is used, an In—Ga—Zn—O film having nitrogen concentration at least higher than that of the oxide semiconductor film 229, specifically, an In—Ga—Zn—O film having nitrogen concentration of 7 at. % or higher is used.

Note that after the gate insulating film 231 is formed, heat treatment may be performed in an inert gas atmosphere or an oxygen atmosphere. The heat treatment temperature is preferably 200° C. to 450° C., more preferably 250° C. to 350° C. With such heat treatment, variations in electrical characteristics of the transistor can be reduced. In the case where oxygen is contained in the gate insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; thus, the heat treatment can also be referred to as supply of oxygen.

Note that in this embodiment, the heat treatment for supply of oxygen is performed after the gate insulating film 231 is formed; however, the timing of the heat treatment for supply of oxygen is not limited thereto, and the heat treatment may be performed after formation of the gate insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurities other than main components of the oxide semiconductor film 229 as little as possible.

Figure 12A:
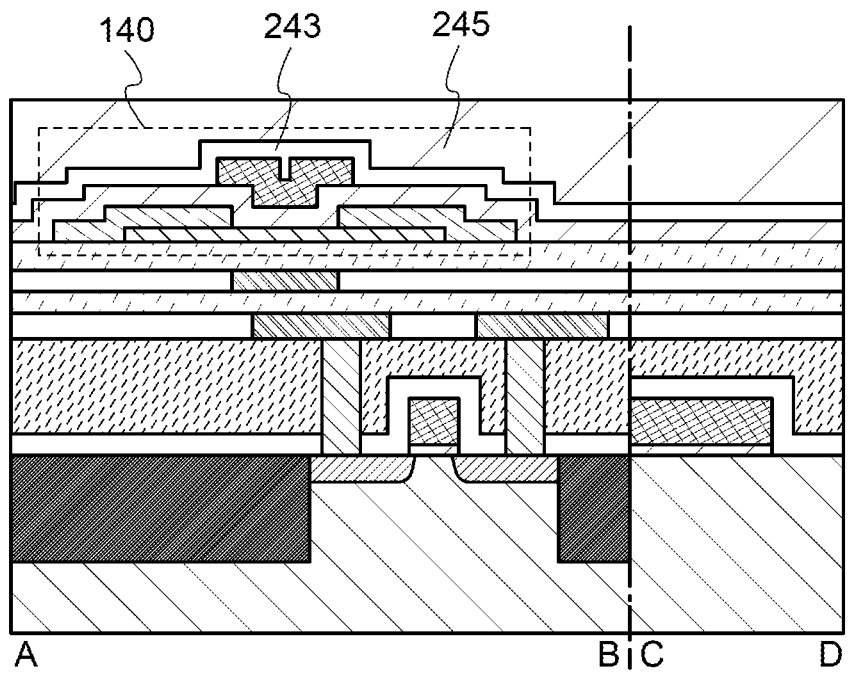
FIGS. 12A and 12B are cross-sectional views illustrating some of steps of manufacturing an alarm device according to one embodiment of the disclosed invention.

Next, as illustrated in FIG. 12A, an insulating film 243 and an insulating film 245 are formed by a sputtering method, a CVD method, a coating method, a printing method, or the like.

The insulating films 243 and 245 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film which prevents diffusion of oxygen into the outside as the insulating film 245, oxygen released from the insulating film 243 can be supplied to the oxide semiconductor film. Typical examples of the insulating film which prevents diffusion of oxygen into the outside include films of aluminum oxide, aluminum oxynitride, and the like. In addition, with the use of an insulating film which prevents diffusion of hydrogen from the outside as the insulating film 245, diffusion of hydrogen from the outside into the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen into the outside, and an oxide insulating film, oxygen can be efficiently diffused into the oxide semiconductor film and oxygen can be prevented from being released into the outside. Accordingly, variations in transistor characteristics can be reduced even at high temperature and in high humidity.

Through the above steps, as illustrated in FIG. 12A, the transistor 140 including an oxide semiconductor film can be formed.

As described above, the oxide semiconductor film 229 is preferably highly purified by sufficient removal of impurities such as hydrogen and sufficient supply of oxygen so as to be supersaturated with oxygen. Specifically, the hydrogen concentration in the oxide semiconductor film 229 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the concentration of hydrogen in the oxide semiconductor film 229 is measured by secondary ion mass spectrometry (SIMS). When the oxide semiconductor film 229 in which the hydrogen concentration is sufficiently reduced for high purification and defect states in an energy gap due to oxygen deficiency are reduced by sufficient supply of oxygen is used for the transistor 140, off-state current (per unit channel width (1 μm) here) at room temperature (25° C.) is 100 zA or lower, preferably 10 zA or lower, for example. In this manner, with the use of an i-type (intrinsic) or substantially i-type oxide semiconductor film 229, the transistor 140 having very good off-state current characteristics can be obtained.

Although the transistor 140 in this embodiment has a top-gate structure, the present invention is not limited thereto, and the transistor 140 may have a bottom-gate structure.

Next, part of each of the insulating films 215, 217, 221, 225, 243, and 245 is selectively etched, so that openings are formed to expose part of each of the gate electrode 209, the electrode 241a, and the electrode 241b. After a conductive film is formed in the openings, part of the conductive film is selectively etched; thus, a wiring 249 which is in contact with the electrode 241b and a wiring 250 which is in contact with the electrode 241a are formed. The wiring 249 and the wiring 250 can be formed using a material used for the contact plugs 219a and 219b as appropriate.

Here, the wiring 249 functions as the node M1 which electrically connects the drain electrode of the transistor 140 to the gate electrode 209 of the transistor 142. The wiring 250 functions as the source electrode of the transistor 140 and is electrically connected to the volatile memory portion 106 in FIG. 4B. Note that in the case where the capacitor 141 in FIG. 4B is provided, for example, an insulating film over the wiring 249 and a conductive film overlapping with the wiring 249 with the insulating film therebetween may be provided.

Figure 12B:
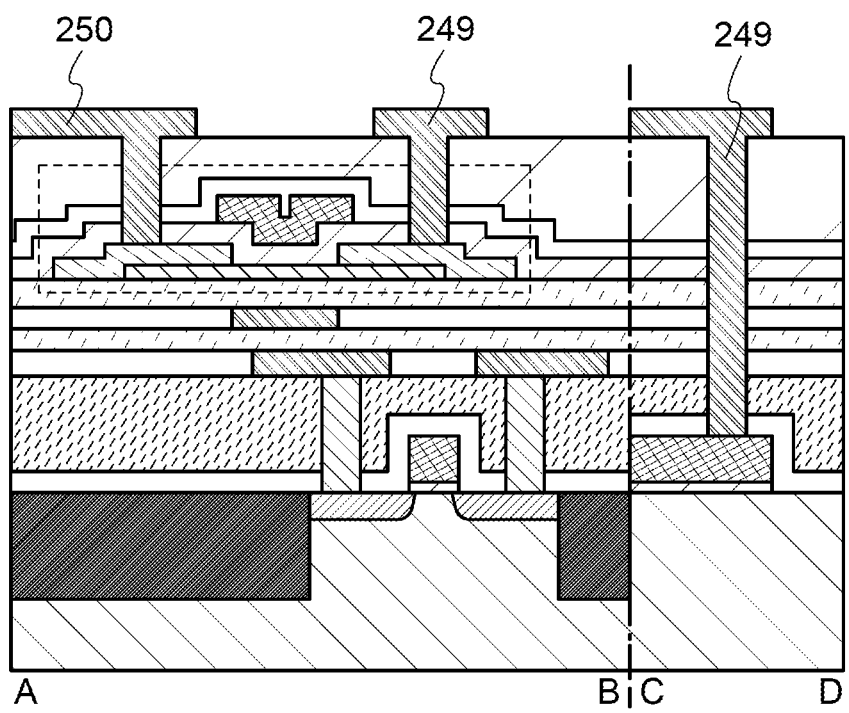

In FIG. 12B, the drain electrode of the transistor 140 and the gate electrode 209 of the transistor 142 are connected to each other through the wiring 249; however, this embodiment is not limited to this structure. For example, an upper surface of the gate electrode of the transistor 142 may be exposed from an upper surface of the insulating film provided over the transistor 142, and one of the source electrode and the drain electrode of the transistor 140 may be formed to be in direct contact with the upper surface of the gate electrode.

Figure 13:
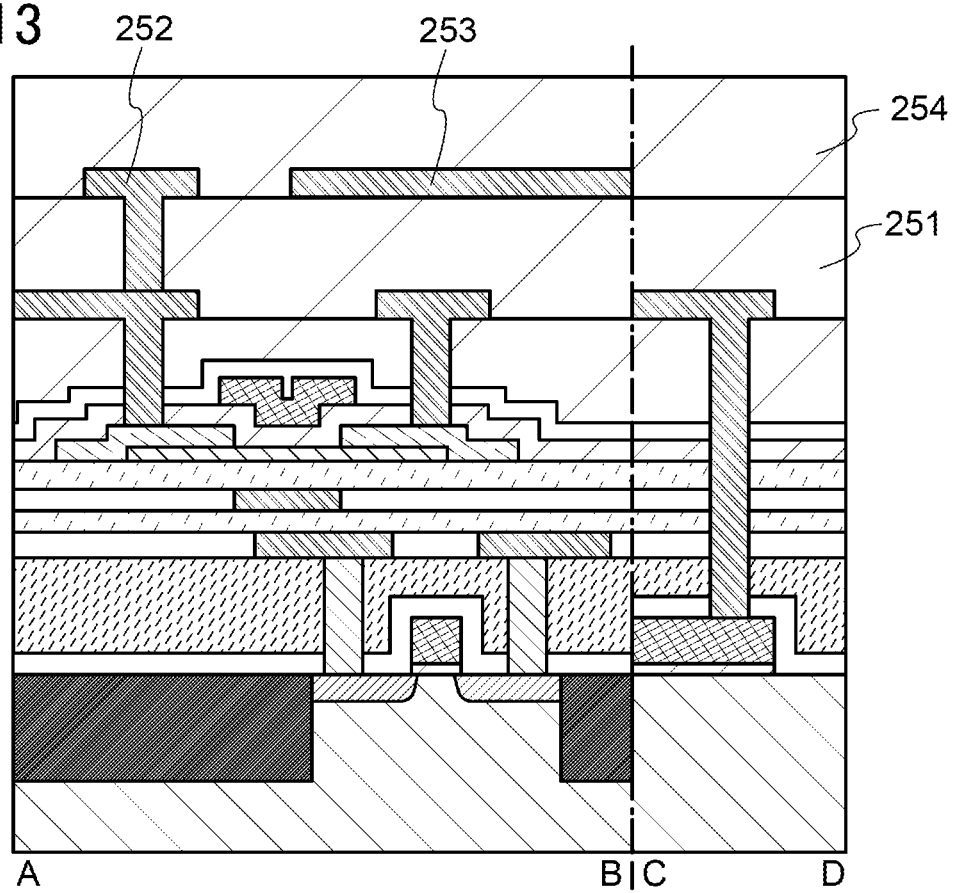
FIG. 13 is a cross-sectional view illustrating some of steps of manufacturing an alarm device according to one embodiment of the disclosed invention.

Note that after the above step, a step of forming an electrode, a wiring, a semiconductor layer, an insulating layer, or the like may be further performed. When a multilayer wiring structure in which an insulating layer and a conductive layer are stacked is employed as a wiring structure, a highly integrated semiconductor device can be obtained. For example, a multilayer wiring structure in which, as illustrated in FIG. 13, an insulating film 251, a wiring 252, a wiring 253, and an insulating film 254 are formed over the wiring 249 and the wiring 250 may be employed. Here, the insulating film 251 and the insulating film 254 can be formed using a material and a method that are similar to those of the insulating film 245, and the wiring 252 and the wiring 253 can be formed using a material and a method that are similar to those of the wiring 249 and the wiring 250.

Through the above steps, the CPU 105 of the microcomputer 100 including the transistors 140 and 142 can be manufactured.

Further, it is preferable that at least part of the transistor 140 overlap with at least part of the transistor 142. It is more preferable that at least part of the oxide semiconductor film 229 overlap with at least part of the n-type impurity region 211a or 211b. With such a planar layout, an increase in area occupied by the CPU due to provision of the transistor including a wide band gap semiconductor such as an oxide semiconductor can be suppressed.

As described above, the transistor of the nonvolatile memory element is formed using a material capable of sufficiently reducing off-state current of a transistor (e.g., an oxide semiconductor material that is a wide band gap semiconductor). Using a semiconductor material capable of sufficiently reducing off-state current of a transistor makes it possible to hold a potential for a long time without supply of power; thus, data can be held in the nonvolatile memory element even when supply of power is stopped by a power gate.

By providing such a CPU including the nonvolatile memory portion, supply of power to the CPU and the like can be stopped by a power gate. Thus, an alarm device in which low power consumption is achieved can be provided.

Further, by the method for manufacturing a transistor, which is described in this embodiment, as well as a CPU including a volatile memory portion, a nonvolatile memory portion, and the like, the photo sensor in FIG. 7 or the temperature sensor in FIG. 8 can be formed.

Figure 14:
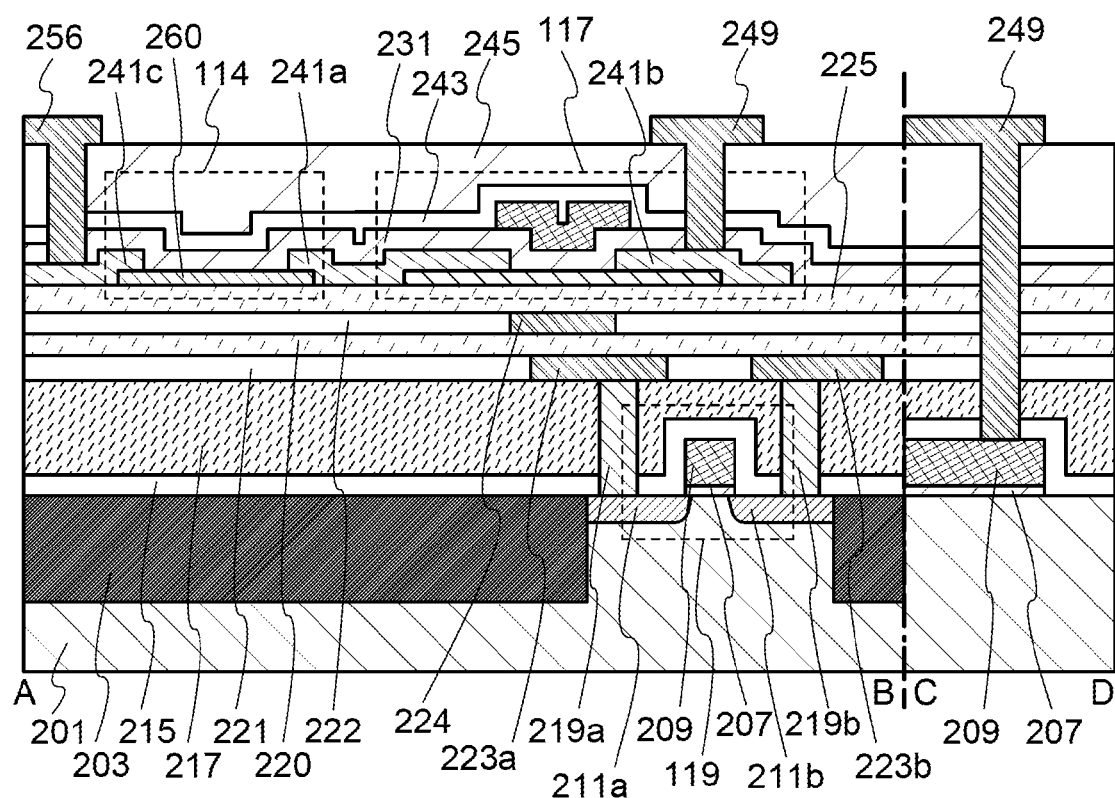
FIG. 14 is a cross-sectional view illustrating some of steps of manufacturing an alarm device according to one embodiment of the disclosed invention.

FIG. 14 is a cross-sectional view in which the photoelectric conversion element 114, the transistor 117, and the transistor 119 of the photo sensor 111 in FIG. 7 are formed using the structure in FIG. 12B. Here, the transistor 119 and the transistor 117 in FIG. 14 correspond to the transistor 142 and the transistor 140 in FIG. 12B, respectively, and also have the same structures as those of the transistors 142 and 140; therefore, description of FIGS. 9A to 9D, FIGS. 10A to 10C, FIGS. 11A to 11C, and FIGS. 12A and 12B can be referred to for the details.

The structure in FIG. 14 is different from the structure in FIG. 12B in that the photoelectric conversion element 114 is electrically connected to the transistor 117 and provided over the insulating film 225.

The photoelectric conversion element 114 includes a semiconductor film 260 provided over the insulating film 225, and a pair of the electrode 241a and an electrode 241c provided on and in contact with the semiconductor film 260. The electrode 241a is an electrode functioning as a source electrode or a drain electrode of the transistor 117 and electrically connects the photoelectric conversion element 114 to the transistor 117.

Over the semiconductor film 260, the electrode 241a, and the electrode 241c, the gate insulating film 231, the insulating film 243, and the insulating film 245 are provided. Further, a wiring 256 is provided over the insulating film 245 and connected to the electrode 241c through an opening provided in the gate insulating film 231, the insulating film 243, and the insulating film 245.

The electrode 241c can be formed in steps similar to those of the electrode 241a and the electrode 241b, and the wiring 256 can be formed in steps similar to those of the wiring 249.

As the semiconductor film 260, a semiconductor film which can perform photoelectric conversion is provided, and for example, silicon, germanium, or the like can be used. In the case of using silicon, the semiconductor film 260 functions as a photosensor which senses visible light. Further, there is a difference, between silicon and germanium, in wavelengths of electromagnetic waves that can be absorbed. When the semiconductor film 260 includes germanium, a sensor which senses infrared ray can be obtained.

As described above, the photo sensor in FIG. 7 and the temperature sensor in FIG. 8 can be formed by the above method. Accordingly, a photosensor portion or a temperature sensor portion can be incorporated into the microcomputer 100 described in Embodiment 1, so that the number of components can be reduced and the housing of the alarm device can be reduced.

The structures, the methods, and the like in this embodiment can be combined with each other, or can also be combined with any of the structures, methods, and the like in the other embodiments as appropriate.

Embodiment 5

In this embodiment, an example of a structure of a microcomputer included in an alarm device according to one embodiment of the present invention, which is different from that in FIG. 1, is described.

Figure 15:
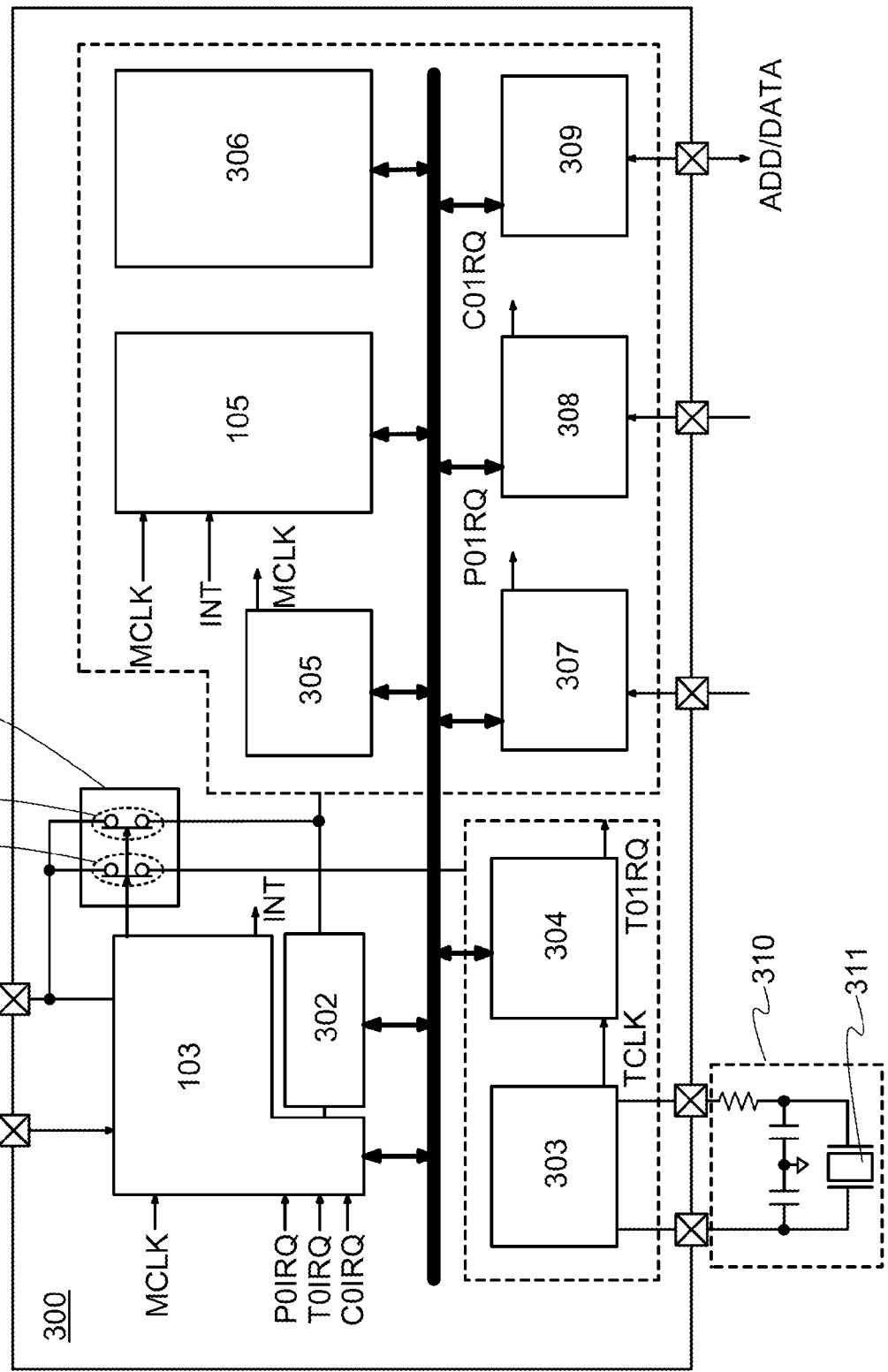
FIG. 15 is a block diagram illustrating a structure of a microcomputer included in an alarm device according to one embodiment of the disclosed invention.

FIG. 15 is a block diagram of a structure of a microcomputer 300. The microcomputer 300 in FIG. 15 includes the power gate controller 103, an interrupt controller 302, an oscillator circuit 303, a timer 304, the power gate 104, the CPU 105, a CR oscillator circuit 305, a memory device 306, an IO port 307, a comparator 308, and an interface (IF) 309 for an external memory device.

Note that FIG. 15 is a block diagram of the microcomputer 300 in the case where an oscillator 310 including a crystal oscillator 311 and the like as its components is electrically connected to the microcomputer 300.

In FIG. 15, an example of a structure of the microcomputer 300 in which the timer 304 and the power gate controller 103 are separately provided; however, as in the microcomputer 100 in FIG. 1, the power gate controller 103 may have a function of a timer.

A digital signal output from the sensor portion 109 described in the above embodiment is input to the microcomputer 300 from the IO port 307. The IO port 307 generates a signal P0IRQ when the above digital signal is input from the sensor portion 109.

Note that an example where a digital signal is output from the sensor portion 109 is shown in the above embodiment, and an analog signal may be output from the sensor portion 109. In this case, the analog signal output from the sensor portion 109 is input to the comparator 308. The comparator 308 has a function of comparing a potential of the above analog signal with a reference potential and generating a digital signal including a comparison result. Further, the comparator 308 generates a signal C0IRQ when the analog signal is input.

The oscillator circuit 303 has a function of generating a clock signal TCLK in accordance with an oscillation frequency determined by the oscillator 310. The timer 304 has a function of measuring time with the use of the clock signal TCLK. The timer 304 also has a function of generating a signal T0IRQ including information of the measured time.

Further, data DATA input to the microcomputer 300 and a signal ADD including address information are transmitted to an external memory device through the IF 309.

The memory device 306 has a function of storing data input through the IF 309 in an address specified by the signal ADD in accordance with an instruction of the CPU 105. In addition, the memory device 306 has a function of sending data read from the address specified by the signal ADD to the CPU 105 in accordance with an instruction of the CPU 105. In such a manner, in accordance with a program stored in the memory device 306, operation of the microcomputer 300 can be controlled. Specifically, it is preferable that the memory device 306 be a nonvolatile memory device including the nonvolatile memory portion 107 described in any of FIGS. 4A to 4C in each bit.

The interrupt controller 302 has a function of judging whether an interrupt request for the CPU 105 is performed or not in accordance with the signal C0IRQ, the signal P0IRQ, and the signal T0IRQ. In the case where interruption is performed, the interrupt controller 302 has a function of generating an interruption signal INT. Note that the interruption signal INT may be generated in the interrupt controller 302 or input to the power gate controller 103 and the interrupt controller 302 from the outside of the microcomputer 300.

The CR oscillator circuit 305 has a function of generating a clock signal MCLK. The clock signal MCLK is supplied to the CPU 105, the power gate controller 103, and the interrupt controller 302.

The power gate controller 103 has a function of controlling on/off states of a power switch 104a and a power switch 104b included in the power gate 104.

When the power switch 104a is in an on-state, the high potential H is supplied to the oscillator circuit 303 and the timer 304 from the high potential power supply line VDD. Further, when the power switch 104a is in an off-state, the high potential H is not supplied to the oscillator circuit 303 and the timer 304 from the high potential power supply line VDD.

When the power switch 104b is in an on-state, the high potential H is supplied to the CR oscillator circuit 305, the CPU 105, the memory device 306, the IO port 307, the comparator 308, and the IF 309 from the high potential power supply line VDD. Further, when the power switch 104b is in an off-state, the high potential H is not supplied to the CR oscillator circuit 305, the CPU 105, the memory device 306, the IO port 307, the comparator 308, and the IF 309 from the high potential power supply line VDD.

Table 1 below shows operation states of the microcomputer 300 under the following conditions: the power switch 104a and the power switch 104b are in an on-state (represented by Active); the power switch 104a is in an on-state and the power switch 104b is in an off-state (represented by Noff1); and the power switch 104a and the power switch 104b are in an off-state (represented by Noff2). Note that in Table 1, the state where the high potential H is supplied is denoted by ON and the state where the high potential H is not supplied is denoted by a symbol —.

TABLE 1

|  | Active | Noff1 | Noff2 |
|---|---|---|---|
| CPU 105 | ON | — | — |
| CR Oscillator Circuit 305 | ON | — | — |
| Oscillator Circuit 303 | ON | ON | — |

TABLE 1-continued

|  | Active | Noff1 | Noff2 |
|---|---|---|---|
| Power Gate Controller 103 | ON | ON | ON |
| Interrupt Controller 302 | ON | — | — |
| IO Port 307 | ON | — | — |
| Timer 304 | ON | ON | — |
| Comparator 308 | ON | — | — |
| Memory Device 306 | ON | — | — |
| IF 309 | ON | — | — |

The structures, the methods, and the like described in this embodiment can be combined as appropriate with any of the methods, structures, and the like described in the other embodiments.

EXPLANATION OF REFERENCE

10: housing, 12: inlet, 14: smoke, 100: microcomputer, 101: direct-current power source, 102: bus line, 103: power gate controller, 104: power gate, 105: CPU, 106: volatile memory portion, 107: nonvolatile memory portion, 108: interface, 109: sensor portion, 110: photosensor portion, 111: photo sensor, 112: amplifier, 113: AD converter, 114: photoelectric conversion element, 115: capacitor, 116: transistor, 117: transistor, 118: transistor, 119: transistor, 120: temperature sensor portion, 121: temperature sensor, 122: amplifier, 123: AD converter, 124: semiconductor element, 125: semiconductor element, 126: constant current circuit, 127: constant current circuit, 130: light-emitting element, 140: transistor, 141: capacitor, 142: transistor, 143: transistor, 144: transistor, 145: selector, 146: inverter, 147: capacitor, 148: flip-flop, 201: semiconductor substrate, 203: element isolation region, 207: gate insulating film, 209: gate electrode, 211a: impurity region, 211b: impurity region, 215: insulating film, 217: insulating film, 219a: contact plug, 219b: contact plug, 220: insulating film, 221: insulating film, 222: insulating film, 223a: wiring, 223b: wiring, 224: electrode, 225: insulating film, 227: oxide semiconductor film, 229: oxide semiconductor film, 231: gate insulating film, 233: gate electrode, 241a: electrode, 241b: electrode, 241c: electrode, 243: insulating film, 245: insulating film, 249: wiring, 250: wiring, 251: insulating film, 252: wiring, 253: wiring, 254: insulating film, 256: wiring, 260: semiconductor film, 300: microcomputer, 302: controller, 303: oscillator circuit, 304: timer, 305: CR oscillator circuit, 306: memory device, 307: IO port, 308: comparator, 309: IF, 310: oscillator, and 311: crystal oscillator.

This application is based on Japanese Patent Application serial no. 2012-126365 filed with Japan Patent Office on Jun. 1, 2012 and Japanese Patent Application serial no. 2012-159898 filed with Japan Patent Office on Jul. 18, 2012, the entire contents of which are hereby incorporated by reference.

The invention claimed is:
1. A device comprising:
a power gate controller electrically connected to a power supply line;
a power gate electrically connected to the power supply line and the power gate controller;
a CPU electrically connected to the power gate; and
a sensor portion electrically connected to the power gate and the CPU,
wherein the power gate controller comprises a timer and is configured to control the power gate with use of the timer, wherein the power gate is configured to allow or stop supply of power from the power supply line to the CPU and the sensor portion, in accordance with control by the power gate controller;

wherein the sensor portion is configured to transmit a measurement value obtained by measuring a physical quantity to the CPU, wherein the CPU is configured to perform an arithmetic processing on the measurement value and transmit a signal based on an arithmetic result, wherein the CPU comprises a first memory portion and a second memory portion electrically connected to the first memory portion, wherein the first memory portion comprises a first transistor which comprises a first semiconductor, wherein the second memory portion comprises a second transistor which comprises a second semiconductor, the second semiconductor having a different band gap width from that of the first semiconductor, and wherein the CPU is configured to store data of the first memory portion in the second memory portion before the power gate stops the supply of power, and restore the data of the second memory portion to the first memory portion when the power gate allows to resume the supply of power.

2. The device according to claim 1, wherein the second transistor comprises an oxide semiconductor film.

3. The device according to claim 2, wherein the oxide semiconductor film comprises indium, gallium, and zinc.

4. The device according to claim 2, wherein the oxide semiconductor film comprises a c-axis aligned crystalline oxide semiconductor.

5. The device according to claim 1, wherein the sensor portion is configured to measure an amount of any one of an ultraviolet ray, an infrared ray, and carbon monoxide as the physical quantity.

6. An alarm device comprising the device according to claim 1, wherein the alarm device is any one of a gas alarm device, a burglar alarm device, and a security alarm device.

7. The device according to claim 1, wherein the device is a microcomputer.

8. The device according to claim 1,
wherein the power gate allows the supply of power continuously in a first period,
wherein the power gate stops the supply of power continuously in a second period, and
wherein the second period is longer than the first period.

9. The device according to claim 8,
wherein the second period is 299 or more times as long as the first period.

10. An alarm device comprising a housing including a microcomputer,
wherein the microcomputer comprises:
a power gate controller electrically connected to a power supply line;
a power gate electrically connected to the power supply line and the power gate controller;
a CPU electrically connected to the power gate; and
a sensor portion electrically connected to the power gate and the CPU,
wherein the power gate controller comprises a timer and is configured to control the power gate with use of the timer,
wherein the power gate is configured to allow or stop supply of power from the power supply line to the CPU and the sensor portion, in accordance with control by the power gate controller;

wherein the sensor portion is configured to transmit a measurement value obtained by measuring a physical quantity relating to a fire to the CPU, wherein the CPU is configured to perform an arithmetic processing on the measurement value and transmit a signal based on an arithmetic result, wherein the CPU comprises a first memory portion and a second memory portion electrically connected to the first memory portion, wherein the first memory portion comprises a first transistor which comprises a first semiconductor, wherein the second memory portion comprises a second transistor which comprises a second semiconductor, the second semiconductor having a different band gap width from that of the first semiconductor, and wherein the CPU is configured to store data of the first memory portion in the second memory portion before the power gate stops the supply of power, and restore the data of the second memory portion to the first memory portion when the power gate allows to resume the supply of power.

11. The alarm device according to claim 10, further comprising a light-emitting element electrically connected to the microcomputer,
wherein the sensor portion comprises a photo sensor configured to measure an amount of light as the physical quantity relating to a fire, and
wherein the light-emitting element and the photo sensor are configured to operate when the power gate allows the supply of power to the sensor portion.

12. The alarm device according to claim 11, wherein light emitted from the light-emitting element is configured to be scattered by smoke entering the housing and then sensed by the photo sensor.

13. The alarm device according to claim 11, wherein the photo sensor comprises a transistor comprising an oxide semiconductor film.

14. The alarm device according to claim 10, wherein the sensor portion comprises a temperature sensor configured to measure a temperature as the physical quantity relating to a fire when the power gate allows the supply of power to the sensor portion.

15. The alarm device according to claim 14, wherein the temperature sensor comprises a semiconductor element comprising an oxide semiconductor and a semiconductor element comprising a silicon semiconductor.

16. The alarm device according to claim 10, wherein power is supplied from a battery to the power supply line.

17. The alarm device according to claim 10, wherein the second transistor comprises an oxide semiconductor film.

18. The alarm device according to claim 17, wherein the oxide semiconductor film comprises indium, gallium, and zinc.

19. The alarm device according to claim 17, wherein the oxide semiconductor film comprises a c-axis aligned crystalline oxide semiconductor.

20. The alarm device according to claim 10,
wherein the CPU is configured to determine whether a fire occurs or not in the arithmetic processing, and
wherein the signal is a fire occurrence signal or a no fire signal.

21. The alarm device according to claim 10,
wherein the power gate allows the supply of power continuously in a first period,
wherein the power gate stops the supply of power continuously in a second period, and
wherein the second period is longer than the first period.

22. The alaram device according to claim 21,
wherein the second period is 299 or more times as long as the first period.

23. A device comprising:
a power supply line;
a power gate electrically connected to the power supply line;
a CPU electrically connected to the power gate; and
a sensor electrically connected to the CPU,
wherein the power gate is configured to control supply of power from the power supply line to the CPU,
wherein the CPU is configured to perform an arithmetic processing on a measurement value received from the sensor and transmit a signal based on a result of the arithmetic processing,
wherein the CPU comprises a first memory portion and a second memory portion electrically connected to the first memory portion, the second memory portion comprising a transistor, the transistor comprising an oxide semiconductor film which comprises a channel formation region, and
wherein the CPU is configured to store data of the first memory portion in the second memory portion before the power gate stops the supply of power, and restore the data of the second memory portion to the first memory portion when the power gate allows to resume the supply of power.

24. The device according to claim 23, wherein the first memory portion comprises a transistor which comprises a single crystal silicon.

25. The device according to claim 23, wherein the CPU is configured to transmit the signal wirelessly.

26. The device according to claim 23, wherein the device is a microcomputer.

27. The device according to claim 23,
wherein the power gate allows the supply of power continuously in a first period,
wherein the power gate stops the supply of power continuously in a second period, and
wherein the second period is longer than the first period.

28. The device according to claim 27,
wherein the second period is 299 or more times as long as the first period.

\* \* \* \* \*